US012652835B2

(12) United States Patent
Bao et al.

(10) Patent No.: US 12,652,835 B2
(45) Date of Patent: Jun. 9, 2026

(54) MULTILAYER WORK FUNCTION METAL IN NANOSHEET STACKS USING A SACRIFICIAL OXIDE MATERIAL

(71) Applicant: International Business Machines Corporation, Armonk, NY (US)

(72) Inventors: Ruqiang Bao, Niskayuna, NY (US); Koji Watanabe, Yokohama (JP); Muthumanickam Sankarapandian, Niskayuna, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 840 days.

(21) Appl. No.: 17/643,553

(22) Filed: Dec. 9, 2021

(65) Prior Publication Data

US 2023/0187495 A1     Jun. 15, 2023

(51) Int. Cl.
*H10D 30/62*          (2025.01)
*H10D 30/67*          (2025.01)
(Continued)

(52) U.S. Cl.
CPC ....... *H10D 62/121* (2025.01); *H10D 30/6217* (2025.01); *H10D 30/6735* (2025.01); *H10D 30/6757* (2025.01); *H10D 64/017* (2025.01)

(58) Field of Classification Search
CPC .............. B82Y 10/00; H10D 30/6217; H10D 30/6735; H10D 30/6757; H10D 62/121;
(Continued)

(56) References Cited

U.S. PATENT DOCUMENTS 9,997,519 B1     6/2018  Bao
10,026,652 B2    7/2018  Wang
(Continued)

FOREIGN PATENT DOCUMENTS

EP          4445422 A1    10/2024
WO      2023/104455 A1     6/2023

OTHER PUBLICATIONS

International Searching Authority, Notification of Transmittal of the International Search Report and the Written Opinion of the International Searching Authority, Feb. 14, 2023, 14 pages, International Application No. PCT/EP2022/082096.

*Primary Examiner* — Meiya Li
(74) *Attorney, Agent, or Firm* — Edward J. Wixted, III

(57)          ABSTRACT

A semiconductor structure is formed using a nanosheet stack that is over a semiconductor substrate. The semiconductor structure includes multiple layers of work function that surround each channel of a plurality of channels in the nanosheet stack and are on the semiconductor substrate under the nanosheet stack. Adjacent layers of the work function metal in the semiconductor structure are separated by an oxide material. The oxide material is a very thin layer of an oxide with a thickness of several angstroms or less. The semiconductor structure includes an n-type work function metal that is over an outer layer of the multiple layers of the work function metal. The n-type work function metal can be an aluminum containing metal that is covered by a capping material under a gate electrode material.

14 Claims, 22 Drawing Sheets

(51) Int. Cl.
    *H10D 62/10*          (2025.01)
    *H10D 64/01*          (2025.01)

(58) Field of Classification Search
    CPC .... H10D 64/017; H10D 30/014; H10D 30/43;
                H10D 64/667; H10D 64/685; H10D
                84/014; H10D 84/038; H10D 84/83
    See application file for complete search history.

(56)                  References Cited

U.S. PATENT DOCUMENTS

| | | | |
|---|---|---|---|
| 10,276,452 B1 | 4/2019 | Seshadri | |
| 10,319,846 B1 | 6/2019 | Ando | |
| 10,490,559 B1 | 11/2019 | Ando | |
| 10,553,495 B2 | 2/2020 | Cheng | |
| 10,700,064 B1 | 6/2020 | Zhang et al. | |
| 2019/0371903 A1 | 12/2019 | Bao | |
| 2019/0393304 A1 | 12/2019 | Guillorn | |
| 2020/0035678 A1* | 1/2020 | Lee | H10D 84/038 |
| 2020/0395458 A1 | 12/2020 | Ando et al. | |
| 2021/0013111 A1 | 1/2021 | Smith et al. | |
| 2021/0098455 A1* | 4/2021 | Yu | H10D 84/0177 |
| 2021/0249517 A1 | 8/2021 | Cheng et al. | |
| 2021/0313454 A1* | 10/2021 | Shen | H01L 21/02186 |
| 2022/0140097 A1* | 5/2022 | Hsu | H10D 30/6757 |
| 2023/0121650 A1* | 4/2023 | Loubet | H10D 64/018 |
| | | | 257/347 |

* cited by examiner

MULTILAYER WORK FUNCTION METAL IN NANOSHEET STACKS USING A SACRIFICIAL OXIDE MATERIAL

BACKGROUND OF THE INVENTION

The present invention relates generally to the field of semiconductor device formation using nanosheet stacks with multiple layers of work function metal to form complementary metal-oxide-semiconductor (CMOS) devices and more particularly to form n-type and p-type field-effect transistors with one or more layers of work function metal providing different threshold voltages.

In order to attain both increased circuit density and required electrical performance, continued innovations in semiconductor process technologies are enabling higher integration densities and device scaling. As the semiconductor industry moves beyond the ten nanometer (nm) technology node and beyond, planar and non-planar semiconductor device structures, such as field-effect transistors formed using CMOS device processes must be scaled to smaller dimensions. One approach to attaining both increasing circuit density and improved electrical performance includes using very thin, vertically stacked nanosheet layers where the nanosheet layers can be patterned and etched to form nanosheet stacks. Typically, the nanosheet stacks form nanosheet field-effect transistor (FET) devices that are considered to be a viable option for continued scaling. In general, a nanosheet FET device comprises a device channel having a nanosheet stack composed of one or more nanosheet layers, with each nanosheet layer having a vertical thickness that is substantially less than the width of the nanosheet layer.

SUMMARY

Embodiments of the present invention disclose a semiconductor structure for a field-effect transistor formed using a nanosheet stack and multiple layers of work function metal surrounding a plurality of channels in the nanosheet stack. Embodiments of the present invention disclose that multiple layers of a work function metal are over each channel of the plurality of channels in the nanosheet stack and are over the semiconductor substrate under the nanosheet stack. Adjacent layers of the work function metal are separated by an oxide material in embodiments of the present invention. Embodiments of the present invention include an n-type work function metal that is over an outer layer of the multiple layers of the work function metal. The n-type work function metal is covered by a capping material that is under a gate electrode material.

Embodiments of the present invention disclose a first layer of a work function metal is around each of the plurality of channels in the nanosheet stack and is on a semiconductor substrate under the nanosheet stack. A first sacrificial oxide material layer is over the first work function metal. The first sacrificial oxide material has a thickness in the range of several angstroms or less after an etching process. Embodiments of the present invention include the semiconductor structure with a layer of a second work function metal that is over the first sacrificial oxide material layer. A second sacrificial oxide material layer is over the second work function metal. The second sacrificial oxide material is a very thin layer of the sacrificial oxide material remaining after an etching process. Embodiments of the present invention include the semiconductor structure with a layer of a third work function metal is over the second sacrificial oxide material. The third work function metal fills gaps between surfaces of the second sacrificial oxide in and under the nanosheet stack. Embodiments of the present invention provide a third sacrificial oxide material layer over exposed surfaces of the third work function metal. The third oxide layer is very thin with a thickness in the range of several angstroms. Embodiments of the present invention disclose a layer of a fourth work function metal over the third sacrificial oxide. Furthermore, embodiments of the present invention provide a fifth work function metal over the fourth work function metal. The fifth work function metal is an n-type work function metal. A cap material covers the fifth work function metal and a gate electrode material is over the cap material.

Embodiments of the present invention provide a method of forming a field-effect transistor from a nanosheet stack that has multiple layers of work function metal around each channel in the nanosheet stack and on a semiconductor substrate under the nanosheet stack. The method includes depositing a first work function metal over a plurality of channels in each nanosheet stack of a plurality of nanosheet stacks and on the semiconductor substrate. The method includes depositing a first oxide material over the first work function metal. The method includes depositing a first soft mask over the plurality of nanosheet stacks, patterning the first soft mask, and removing the first soft mask from at least one of the plurality of nanosheet stacks. The method includes removing the first oxide material and the first work function metal from at least one of the nanosheet stacks. The method includes removing the first soft mask remaining on one or more of the nanosheet stacks. The method includes removing a top portion of the first oxide material from one or more of the nanosheet stacks, wherein a bottom portion of the first oxide material remains on the first work function metal.

Furthermore, embodiments of the present invention include depositing a second work function metal over the plurality of channels in the plurality of nanosheet stacks and under each of the plurality of nanosheet stacks on a semiconductor substrate. The method includes depositing a second oxide material over the second work function metal. The method includes depositing and patterning a second soft mask over the plurality of nanosheet stacks. The method includes removing the second soft mask from at least two of the plurality of nanosheet stacks and, then removing the second oxide material and the second work function metal from at least two of the plurality of nanosheet stacks. The method includes removing the second soft mask from a nanosheet stack that is still covered by the remaining portions of the second soft mask. After removing the remaining portions of the soft mask, the method includes removing a top portion of the second oxide material from two or more of the plurality of nanosheet stacks. The bottom portion of the second oxide material remains on the work function metal. Embodiments of the present invention include depositing a third work function metal over the remaining bottom portion of the second oxide material where the remaining portion of the second oxide is several angstroms thick. Additionally, embodiments of the present invention include depositing an n-type work function metal over the third work function metal. The n-type work function metal fills the gaps between adjacent surfaces of the third work function metal. The method includes depositing a metal nitride capping layer over the n-type work function metal and depositing a gate electrode material over the capping layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
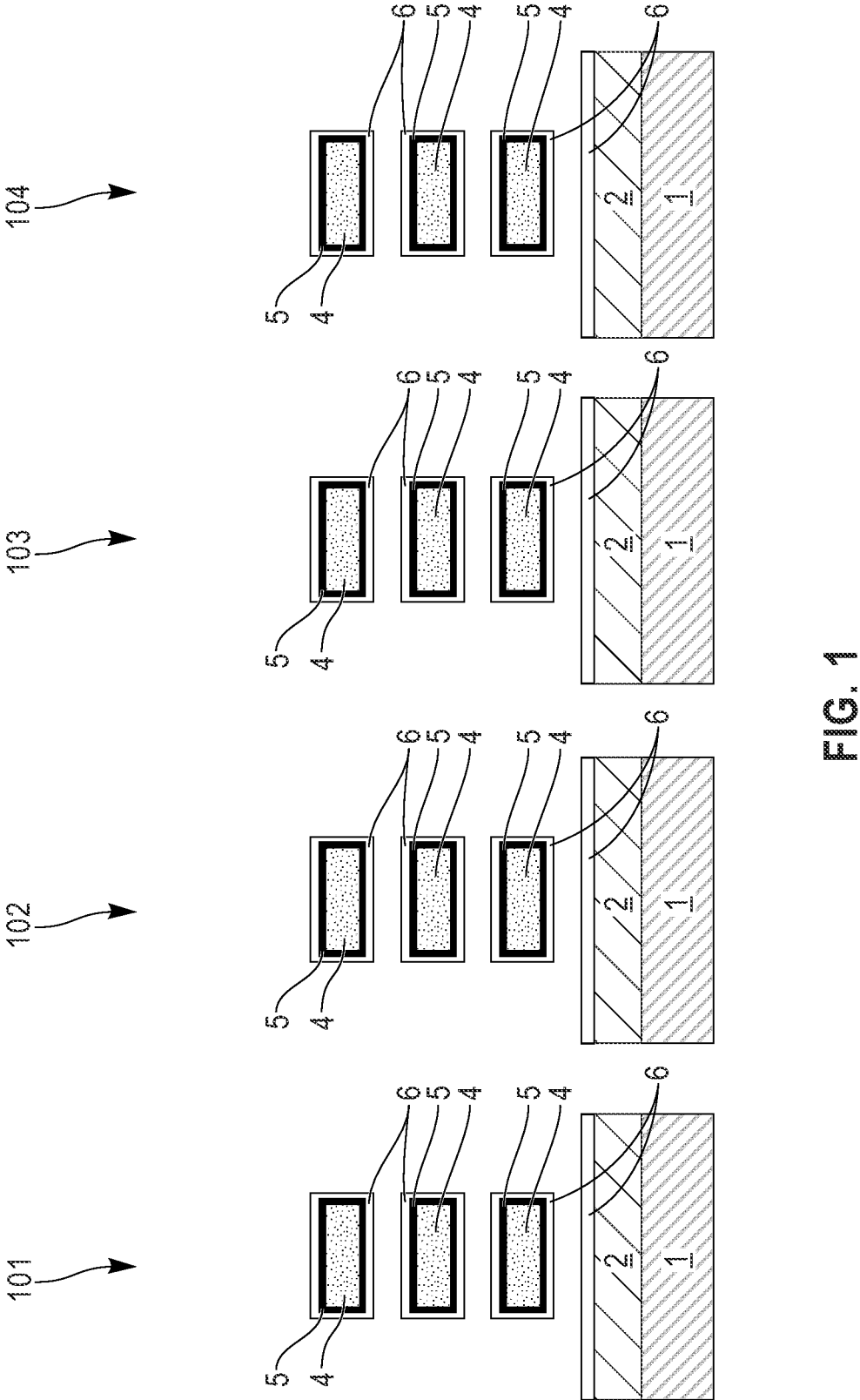
FIG. 1 depicts a cross-sectional view of a semiconductor structure with four nanosheet stacks each on a portion of the semiconductor substrate, in accordance with an embodiment of the present invention.

Nanosheet (NS) transistors are being pursued as a viable device architecture for scaling CMOS devices in advanced technologies beyond the ten nm node. One challenge in fabricating NS transistors is the difficulty of removing the soft mask material between channels in an NS stack forming the NS transistor. After depositing a layer of a work function metal, which is also known as a work function metal, over the portions of the channel material in an NS stack forming an NS transistor, a layer of a soft mask material is deposited over and around the channels in the NS stack. In order to form NS transistors with more than one layer of work function metal (WFM), it is necessary to remove the soft mask material between the channels in the NS stack. The soft mask material can be patterned, and portions of the soft mask material are removed over one or more NS stacks to unblock or expose the selected NS stacks. Conventional etching processes for soft mask removal leave a significant amount of soft mask material between adjacent channels in an NS stack and therefore limits the number of layers of a WFM that can be deposited around the channels in the NS stack. Elemental mapping of the NS stacks after soft mask removal identifies significant amounts of the soft mask between adjacent channels in the NS stack.

It is desirable to have the ability to deposit multiple layers of work function metals around the channels in the NS stack in order to provide a higher effective work function of the NS transistor. An ability to provide a different number of layers of the WFM can provide a range of effective work function values and an associated range of threshold voltages associated with the completed NS transistors. It is desirable to provide a clean and open area between the adjacent portions of the channels in the NS stack to allow the deposition of multiple layers of WFM in the NS stack in order to provide a range of effective work functions in NS stack forming NS transistors, such as field-effect (FET) devices.

Embodiments of the present invention provide a number of semiconductor structures that can be used in either n-type FETS (NFETs) or p-type FETs (PFETs) formed from nanosheet stacks with multiple layers of WFM that have a thin layer of a sacrificial oxide layer over each channel in the nanosheet stack. The method of forming the various semiconductor structures for the FET devices (i.e., NS transistors) provides a way to form the FET devices with one or more layers of WFM over channel portions of the nanosheet stacks. The method provides semiconductor structures with a thin layer of sacrificial oxide material between each layer of WFM in the nanosheet stack. The method creates semiconductor structures for the FET devices that can have one, two, three, or more layers of a WFM to provide a range of desired effective work functions for the various FET devices. Embodiments of the present invention provide both methods of forming FET devices with a desired effective work function and semiconductor structures with the desired number of layers of WFM to provide a desired effective work function for each of the FET devices.

Embodiments of the present invention provide a method of forming the FET devices using an NS stack with an interfacial layer (IL) over each channel in the NS stacks on a semiconductor substrate. A layer of a high-k dielectric material, such as a hafnium oxide is deposited over the IL on the channels and above the semiconductor substrate. The method includes depositing a WFM, such as a metal nitride material over the high-k dielectric material. A sacrificial oxide is conformally deposited over the WFM and pinches off the space between adjacent channels in the NS stack. The sacrificial oxide material, such as a lanthanum oxide, a yttrium oxide, or other similar oxide material is easier to remove from the gaps between the adjacent channels than the conventionally used soft mask materials. The larger space between adjacent channels in the nanosheet stack provides more space to deposit additional layers of WFM between adjacent channels in the NS stack.

The method includes depositing a soft mask material over the sacrificial oxide that is patterned and selectively removed to reveal one or more of the nanosheet stacks. After exposing one or more of the nanosheet stacks, the sacrificial oxide and the WFM metal are removed using one or more isotropic etching processes or wet etching processes. The remaining soft mask is removed from any protected or blocked nanosheet stacks and the top portion of the sacrificial oxide is removed from each of the protected or blocked nanosheet stacks, for example using wet etching process. A thin layer of a portion of the sacrificial oxide material remains on the WFM of the previously blocked nanosheet stack. Another layer of a WFM can be deposited over the nanosheet stacks. A second layer of the soft mask can be deposited over the semiconductor substrate and the above processes can be repeated to leave the second layer of the WFM with the very thin bottom portion of the sacrificial oxide layer remaining on the second WFM. These processes may be repeated as many times as space is remaining between adjacent channels in the nanosheet stack allow. In various embodiments, a third WFM can be deposited over the remaining portion of the second sacrificial oxide layer followed by a deposition of an n-type WFM, a capping metal nitride material, and a layer of a gate electrode material to form a FET device. Using known back end of line processes, FET contacts and interconnections can be formed. Embodiments of the present invention provide a method to create FET devices using nanosheet stacks and sacrificial oxide materials that have multiple layers of WFM where more layers of the WFM create a higher effective work function in the FET device.

The following description with reference to the accompanying drawings is provided to assist in a comprehensive understanding of exemplary embodiments of the invention as defined by the claims and their equivalents. The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layers at the interface of the two elements.

In the interest of not obscuring the presentation of embodiments of the present invention, in the following detailed description, some processing steps or operations that are known in the art may have been combined for presentation and illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The methods described herein can be used in the fabrication of integrated circuit chips or semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described. It will be understood that, although the terms first, second, etc. can be used herein to describe various elements, these elements should not be limited by these terms. These terms are only used to distinguish one element from another element. Thus, the first element discussed below could be termed a second element without departing from the scope of the present concept.

Deposition processes for the materials used hereinafter such as the deposition of metal materials, work function materials, dielectric materials, and sacrificial materials, include, e.g., chemical vapor deposition (CVD), physical vapor deposition (PVD), atomic layer deposition (ALD), or gas cluster ion beam (GCIB) deposition. CVD is a deposition process in which a deposited species is formed as a result of a chemical reaction between gaseous reactants at greater than room temperature (e.g., from about 25 C to about 900 C.). The solid product of the reaction is deposited on the surface on which a film, coating, or layer of the solid product is to be formed. Variations of CVD processes include, but are not limited to, atmospheric pressure CVD (APCVD), low-pressure CVD (LPCVD), plasma-enhanced CVD (PECVD), and metal-organic CVD (MOCVD), and combinations thereof may also be employed. In alternative embodiments that use PVD, a sputtering apparatus may include direct-current diode systems, radio-frequency sputtering, magnetron sputtering, or ionized metal plasma sputtering. In alternative embodiments that use ALD, chemical precursors react with the surface of a material one at a time to deposit a thin film on the surface.

Removing a material or selectively etching as used herein includes but is not limited to patterning a soft mask material, for example, using one of lithography, photolithography, an extreme ultraviolet (EUV) lithography process, or any other known semiconductor patterning process followed by one or more the etching processes. The terms, blocked or unblocked, as used hereinafter, generally refer to regions of a semiconductor structure or a nanosheet stack that are covered or "blocked" by remaining portion a patterned and etched soft mask material or that are protected from a following etch process or regions of the semiconductor that are uncovered or "unblocked" that can be etched by the etching processes. Various materials are referred to herein as being removed or "etched" where etching generally refers to one or more processes implementing the removal of one or more materials. Some examples of etching processes include but are not limited to the following processes, such as a dry etching process using a reactive ion etch (RIE) or ion beam etch (IBE), a wet chemical etch process, or a combination of these etching processes. A dry etch may be performed using a plasma.

Reference is now made to the figures. The figures provide a schematic cross-sectional illustration of semiconductor devices at intermediate stages of fabrication, according to one or more embodiments of the invention. The schematic representations of the devices of the invention and are not to be considered accurate or limiting with regards to device element scale.

FIG. 1 depicts a cross-sectional view of a semiconductor structure with four nanosheet stacks each on a portion of substrate 1, in accordance with an embodiment of the present invention. As depicted, FIG. 1 includes substrate 1, isolation layer 2, channels 4, interfacial layer (IL) 5 around each of channels 4, and dielectric 6 over and around each of dielectric 6 on IL 5 and on isolation layer 2. Each of nanosheet stack (NS) 101, 102, 103, and 104 include three portions of channel 4 that are surrounded by IL 5 and dielectric 6. Each of NS 101, 102, 103, and 104 reside above dielectric 6 on isolation layer 2 of substrate 1. Each of NS 101, 102, 103, and 104 are formed using known nanosheet stack formation processes and is not limited to nanosheet stacks with three channel layers that are depicted as three portions of channels 4 in FIG. 1.

In various embodiments, channels 4 are composed of silicon but are not limited to this semiconductor material. Channels 4 may be any semiconductor material used as a channel nanosheet layer in a nanosheet stack. Each of channels 4 may have a thickness ranging from 2 and 20 nanometers but is not limited to these thicknesses.

IL 5 can be a layer of an oxide dielectric material, such as SiOx or SiNOx but is not limited to these materials. The suffix x here can be any number or integer, such as 2 in $SiO_2$. IL 5 is covered by a layer of a high-k dielectric material or a higher k gate dielectric material including but not limited to $HfO_2$, $La_2O_3$, $Zr_2O_3$, etc. that can be deposited by one of PVD, CVD, or ALD. In various embodiments, IL 5 is formed with a chemical treatment, an annealing process, or a deposition process such as ALD and IL 5 may have a thickness between 0.5 nm to 1.5 nm but is not limited to these thicknesses.

Dielectric 6 resides on IL 5 that surrounds adjacent channels 4 in each of NS 101, 102, 103, and 104 and on isolation layer 2 on substrate 1. In some embodiments, dielectric 6 is composed of a high-k dielectric material (i.e., with a dielectric constant greater than 4). In an embodiment, dielectric 6 is a dielectric material with a dielectric constant equal to or less than 4. For example, dielectric 6 can be composed of but not limited to one of a hafnium oxide (e.g., $HfO_2$), a hafnium silicon oxide, a hafnium silicon oxynitride (e.g., HfSiON), a lanthanum oxide (e.g., $La_2O_3$), a tantalum oxide (e.g., TaO), titanium oxide (e.g., TiO), silicon dioxide, etc. Dielectric 6 may be deposited by ALD, CVD, or PVD.

A typical distance between dielectric 6 on adjacent channels 4 can be 4 nm to 12 nm but is not limited to these distances.

Figure 22:
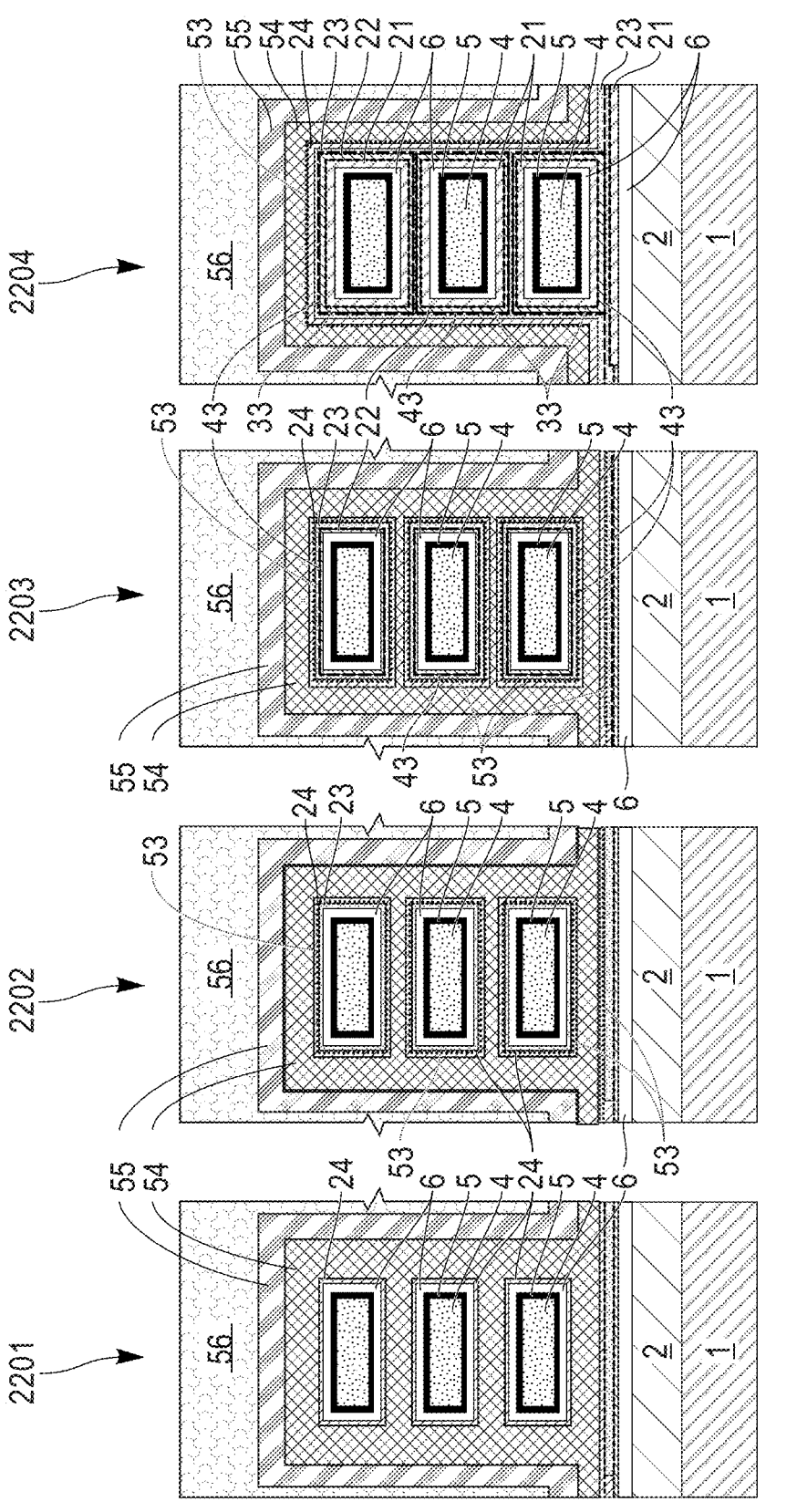
FIG. 22 depicts a cross-sectional view of the semiconductor structures after depositing an n-type WFM under and around each channel portions of the first three nanosheet stacks and over the fourth nanosheet stack, depositing a cap material over exposed surfaces of the n-type WFM in each of the nanosheet stacks, and then depositing gate electrode material over each of nanosheet stacks and above the semiconductor substrate, in accordance with an embodiment of the present invention.

NS 101, 102, 103, and 104 are pre-cursors to one of an NFET or a PFET device semiconductor structure. In various embodiments, upon completion of the NS transistors depicted later in FIG. 22, pairs of NS transistors (not depicted) with an NFET and a PFET can't share a gate electrode. The two transistors may be formed from any of the resulting FET structures created from NS 101, 102, 103, and 104 after processing is completed (e.g., as depicted in FIG. 22). As known to one skilled in the art, the type of materials (e.g., an n-type material or a p-type material in the FET junction) used in each of the NS determines if the nanosheet stack forms an NFET or a PFET.

Substrate 1 can be a semiconductor substrate composed of any known semiconductor substrate material used in CMOS processing. For example, substrate 1 can be composed of a silicon semiconductor material, another group IV semiconductor material (e.g., Ge), a group III-V semiconductor material (e.g., gallium arsenide), a group II-VI semiconductor material, or other known semiconductor material or compounds of any known semiconductor material used in semiconductor circuits where the groups are columns or groups of elements in the Periodic Table. In some embodiments, substrate 1 includes one or more of doped, undoped, or contains doped regions, undoped regions, stressed regions, or defect-rich regions. In some examples, substrate 1 may include one or more other devices or transistors (not depicted). In an embodiment, substrate 10 is one of a layered semiconductor substrate, such as a semiconductor-on-insulator substrate (SOI), Ge on insulator (GeOI), or silicon-on-replacement insulator (SRI). A layer of dielectric 6 is over isolation layer 2 on substrate 1.

While substrate 1 is depicted as four separate portions of a semiconductor substrate where each portion substrate 1 is below one of NS 101, 102, 103, and 104 in various embodiments, substrate 1 is a single semiconductor substrate with one or more nanosheet stacks. Substrate 1 can have less than or more nanosheet stacks than NS 101, 102, 103, and 104 in other examples (not depicted). For example, substrate 1 may have 20 nanosheet stacks.

Figure 2:
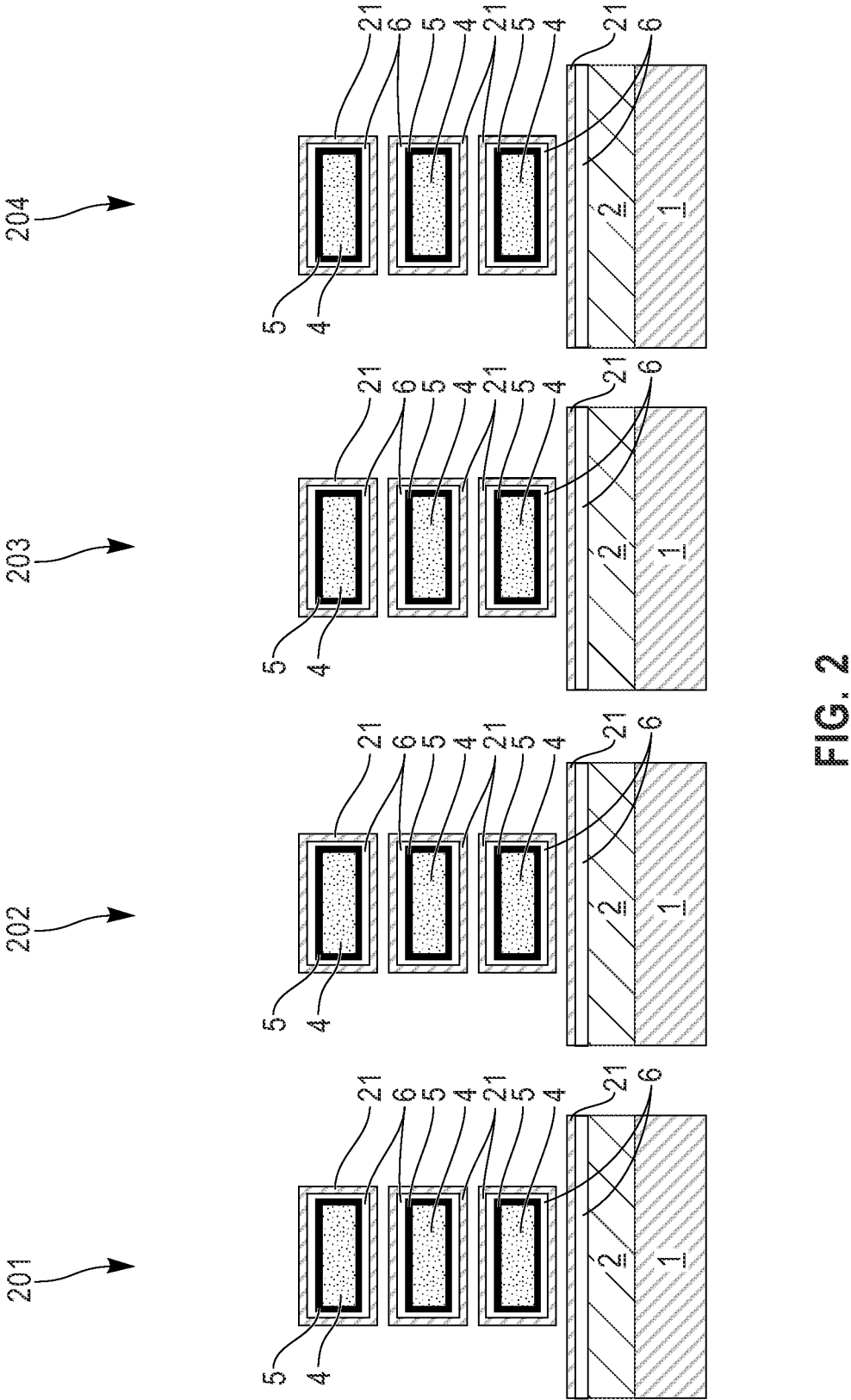
FIG. 2 depicts the cross-section view of the semiconductor structures after depositing a layer of work function metal (WFM) over exposed surfaces of the semiconductor structures, in accordance with an embodiment of the present invention.

FIG. 2 depicts the cross-section view of the semiconductor structures after depositing a layer of work function metal (WFM) 21 over exposed surfaces of the semiconductor structures, in accordance with an embodiment of the present invention. As depicted, FIG. 2 includes NS 201, 202, 203, and 204, substrate 1, isolation layer 2, channels 4, interfacial layer (IL) 5 around each of channels 4, dielectric 6, and WFM 21. In various embodiments, WFM 21 is composed of a metal nitride material. For example, WFM 21 can be titanium nitride (TiN) but is not limited to this material. WFM 21 can be deposited by ALD, PVD, or CVD with a thickness ranging from 0.5 nm to 5 nm but is limited to this range of thicknesses. WFM 21 is the first layer of a work function metal deposited over each of NS 201, 202, 203, and 204 as depicted in FIG. 2.

Figure 3:
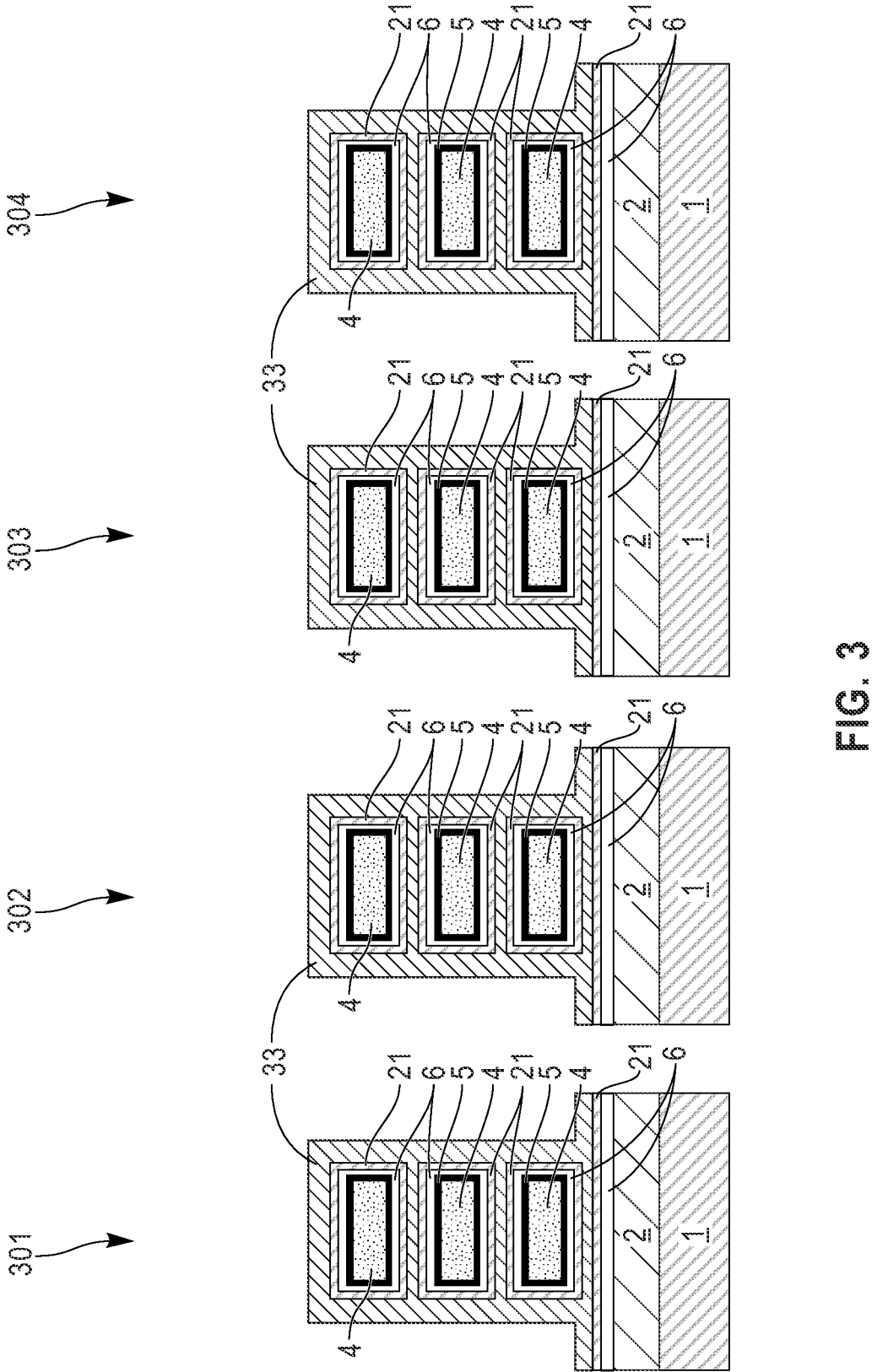
FIG. 3 depicts a cross-sectional view of the semiconductor structures after depositing a layer of a sacrificial oxide material over exposed surfaces of the semiconductor structures, in accordance with an embodiment of the present invention.

FIG. 3 depicts a cross-sectional view of the semiconductor structures after depositing a layer of sacrificial oxide 33 over exposed surfaces of the semiconductor structures, in accordance with an embodiment of the present invention. As depicted, FIG. 3 includes NS 301, 302, 303, and 304 with WFM 21 covered by sacrificial oxide 33. Each of NS 301, 302, 303, and 304 are above a portion of substrate 1. Sacrificial oxide 33 may be deposited by one of PVD, CVD, or ALD over WFM 21. In various embodiments, sacrificial oxide 33 is one of a lanthanum oxide or a yttrium oxide but is not limited to these oxide materials. For example, sacrificial oxide 33 may be $La_2O_3$ or $Y_2O_3$. Sacrificial oxide 33 is conformally deposited and fills the area or space between WFM 21 on adjacent channels 4 and the space between WFM 21 on the bottom portion of channels 4 and WFM 21 on dielectric 6 above isolation layer 2 on substrate 1.

Figure 4:
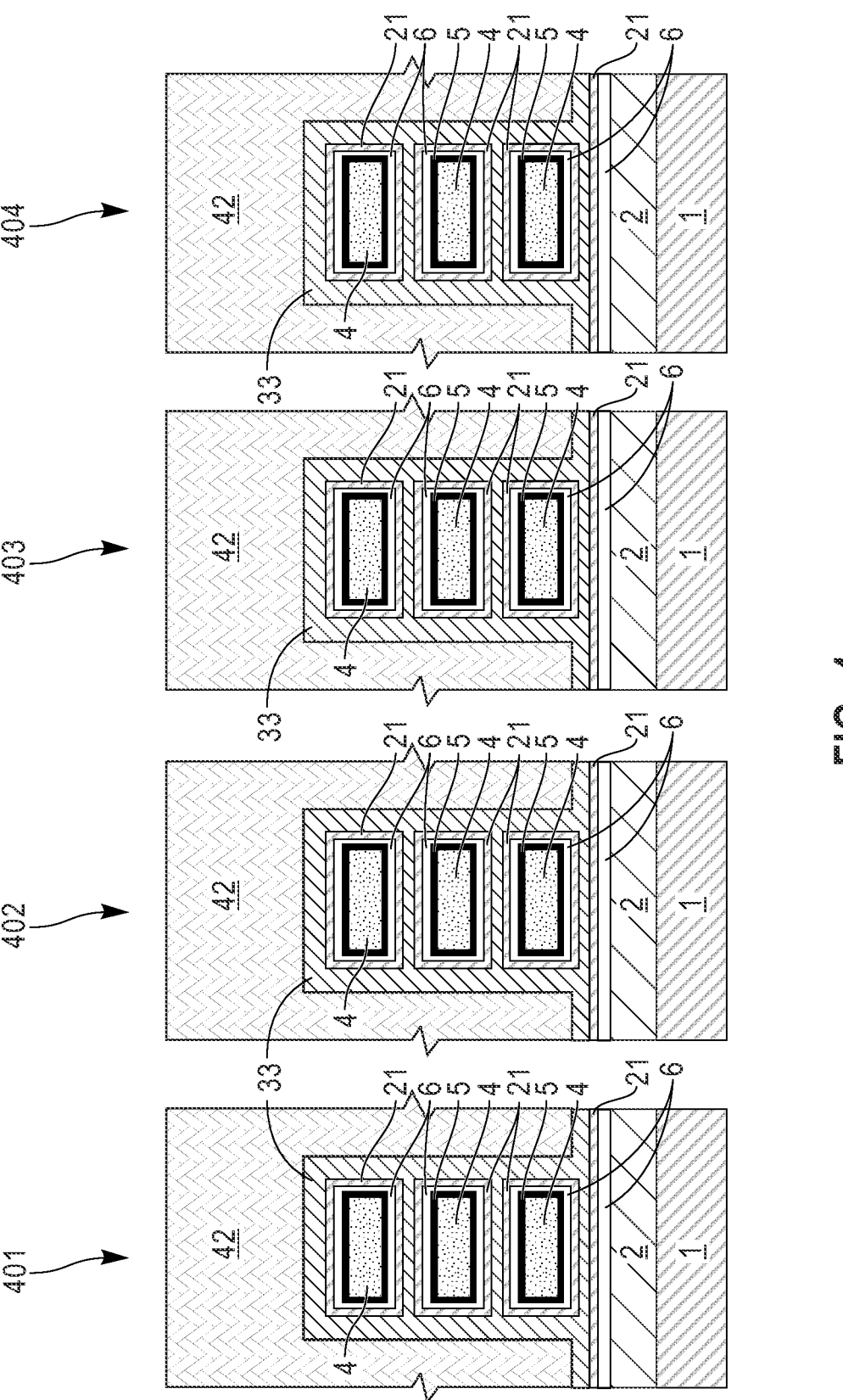
FIG. 4 depicts a cross-sectional view of the semiconductor structures after depositing a layer of a soft mask material over each of the semiconductor structures, in accordance with an embodiment of the present invention.

FIG. 4 depicts a cross-sectional view of the semiconductor structures after depositing a layer of soft mask 42 over each of the semiconductor structures, in accordance with an embodiment of the present invention. As depicted, FIG. 4 includes the elements of FIG. 3 and soft mask 42 over and extending above the top of sacrificial oxide 33. Soft mask 42 can be any soft mask material used in FET formation with nanosheet stacks. For example, soft mask 42 can be an organic planarization layer (OPL) that is deposited over each of the four semiconductor structures. Soft mask 42 may act as a resist.

Figure 5:
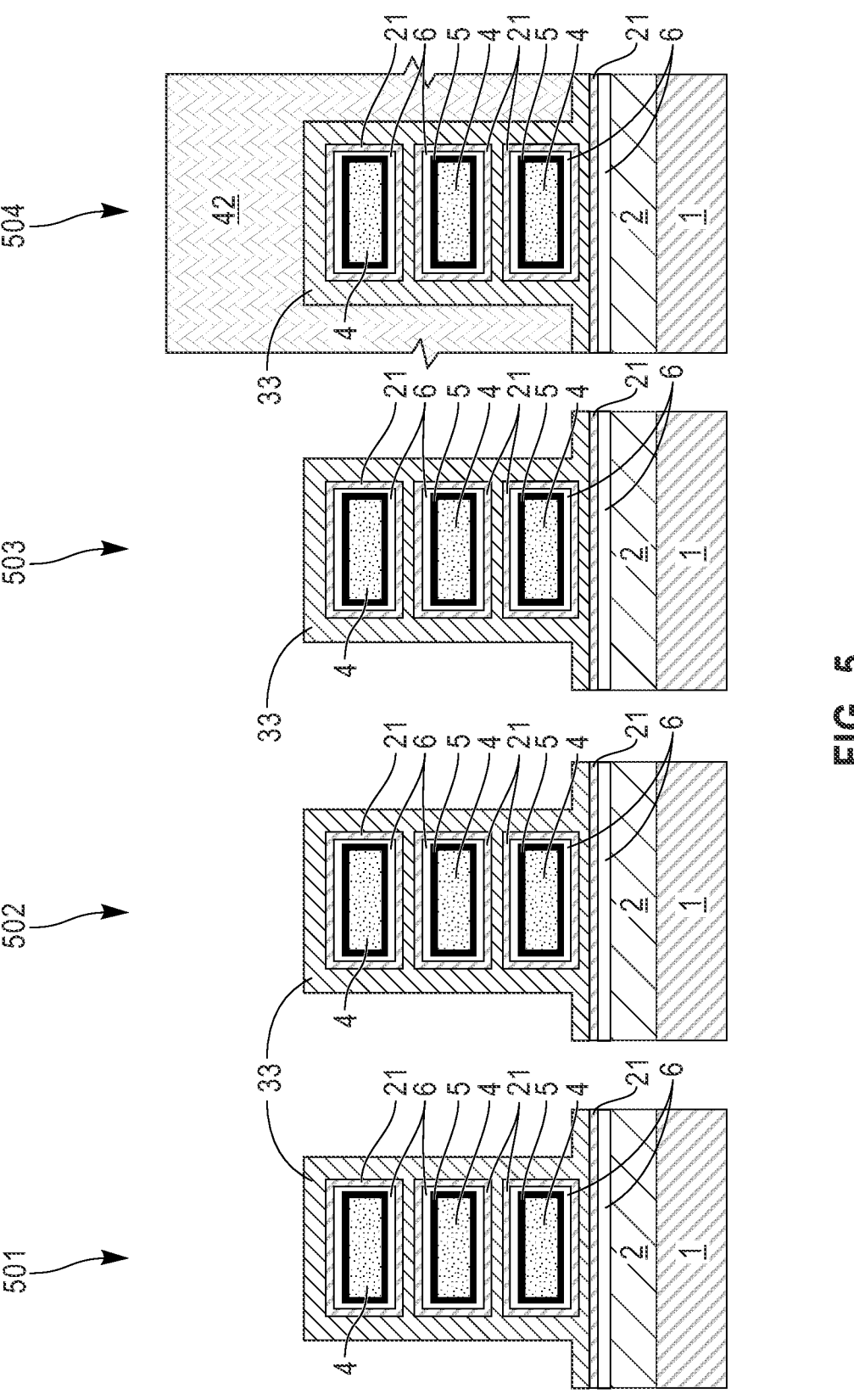
FIG. 5 depicts a cross-sectional view of the semiconductor structures after unblocking each of the four nanosheet stacks, in accordance with an embodiment of the present invention

FIG. 5 depicts a cross-sectional view of the semiconductor structures after unblocking NS 501, 502, and 503, in accordance with an embodiment of the present invention. As depicted, FIG. 5 includes unblocked NS 501, 502, and 503 and blocked NS 504. Soft mask 42 is patterned and removed over sacrificial oxide 33 on each of NS 501, 502, and 503. Soft mask 42 can be patterned and portions of soft mask 42 stripped in order to selectively remove soft mask 42 from NS 501, 502, and 503. The uncovered portions of the semiconductor structures (e.g., NS 501, 502, and 503) are unblocked. The remaining portion of soft mask 42 remains over or blocks NS 504.

Figure 6:
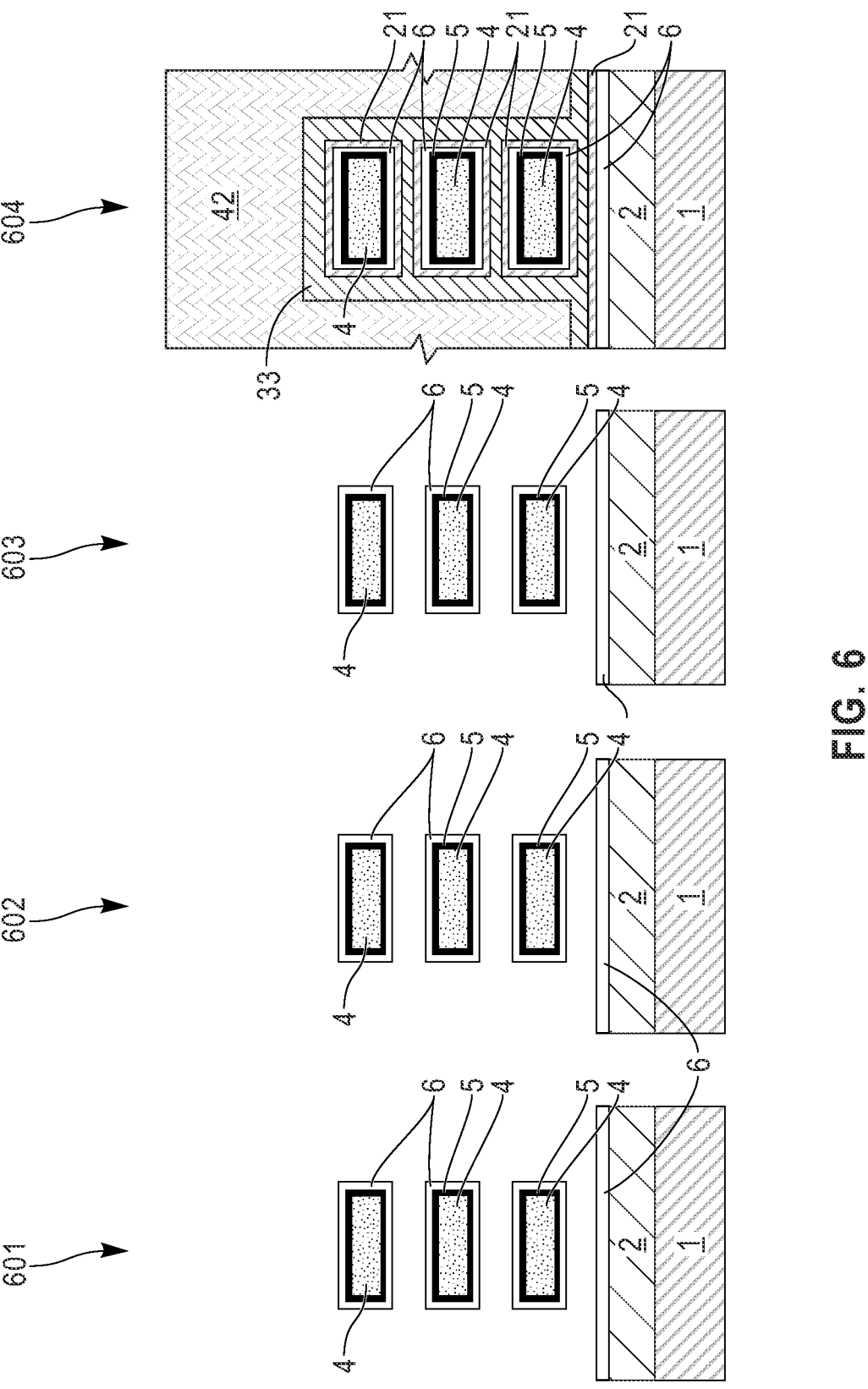
FIG. 6 depicts a cross-sectional view of the semiconductor structures after removing the sacrificial oxide and the WFM from three of the four nanosheet stacks, in accordance with an embodiment of the present invention.

FIG. 6 depicts a cross-sectional view of the semiconductor structures after removing sacrificial oxide 33 and WFM 21 from NS 601, 602, and 603, in accordance with an embodiment of the present invention. As depicted, FIG. 6 includes each of NS 604 covered by soft mask 42 and each of NS 601, 602, and 603 without sacrificial oxide 33 and WFM 21. As depicted, sacrificial oxide 33 and WFM 21 remain under soft mask 42 in NS 604.

Using one or more etching processes, such as one or more wet etching processes or a combination of a dry etch process with one or more wet etching processes, sacrificial oxide 33 is removed, followed by the removal of WFM 21 from NS 601, 602, and 603. For example, a wet etching process using hydrogen chloride (HCl) removes sacrificial oxide 33. Using the etching process, sacrificial oxide 33 is effectively removed from the gaps between adjacent surfaces of dielectric 6. In some embodiments, other etching processes may be used to remove WFM 21 or sacrificial oxide 33 depending on the specific composition of these materials. Sacrificial oxide 33 can be completely removed between adjacent portions of channel 4 covered by dielectric 6 in NS 601, 602, and 603.

As previously discussed, in conventional nanosheet stacks formed with a soft mask material between adjacent surfaces of materials, such as a soft mask material between WFM 21 over channels 4, it is difficult to remove the soft mask material on WFM 21 and between dielectric 6 on channels 4. In conventionally formed nanosheet stacks, the gaps between adjacent channels 4 may not be completely opened up when a soft mask material is between channels 4 rather than sacrificial oxide 43. When the gaps between adjacent channels 4 are not opened up in conventional nanosheet stack, it limits the deposition of additional layers of WFM in later process steps.

Figure 7:
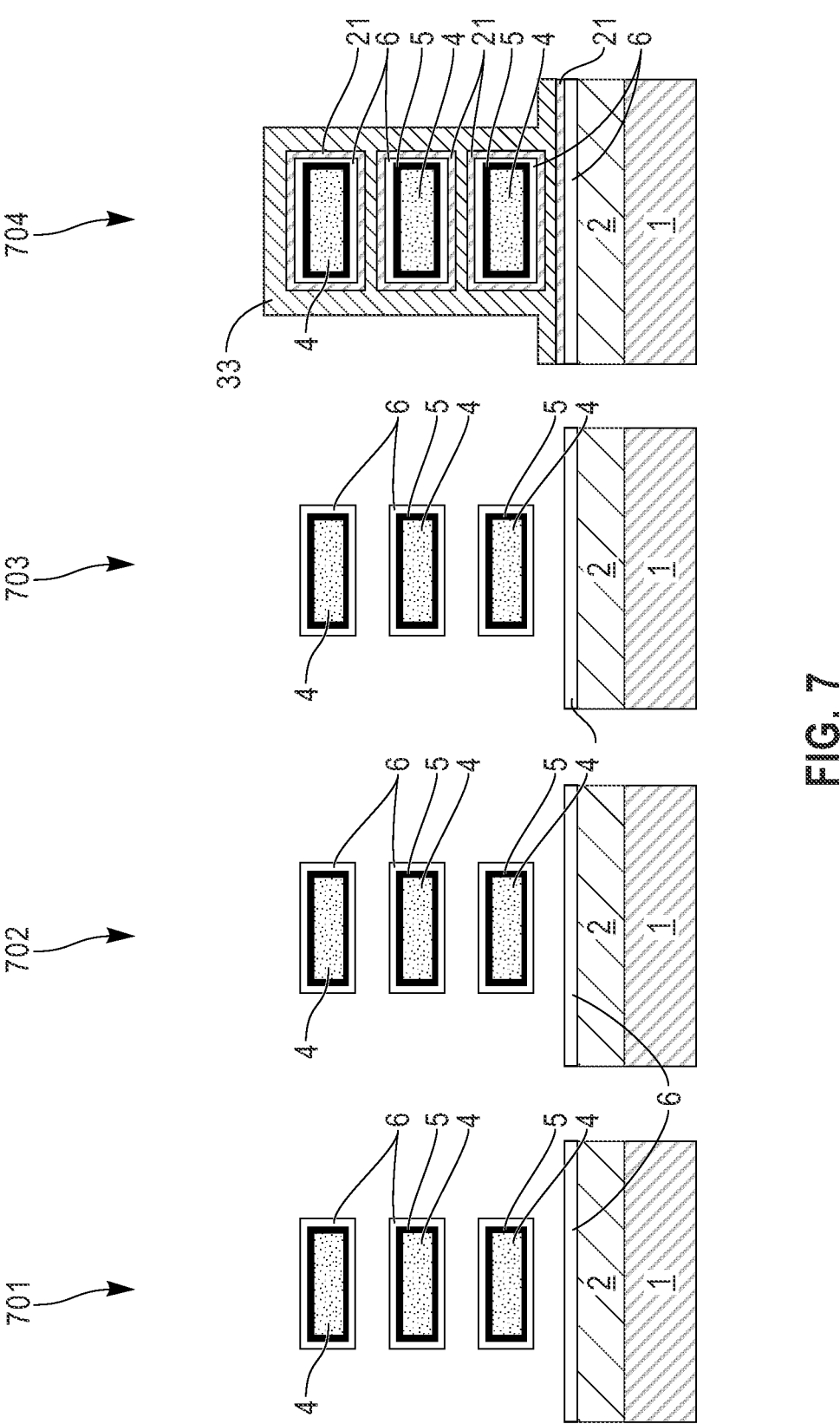
FIG. 7 depicts a top view of the semiconductor structures after removing the soft mask from the fourth nanosheet stack, in accordance with an embodiment of the present invention.

FIG. 7 depicts a top view of the semiconductor structures after removing soft mask 42 from NS 704, in accordance with an embodiment of the present invention. As depicted, FIG. 7 includes NS 601, 602, and 603 which are unchanged from FIG. 6 and unblocked NS 704. Soft mask 42 is removed from sacrificial oxide 33 on NS 704

Figure 8:
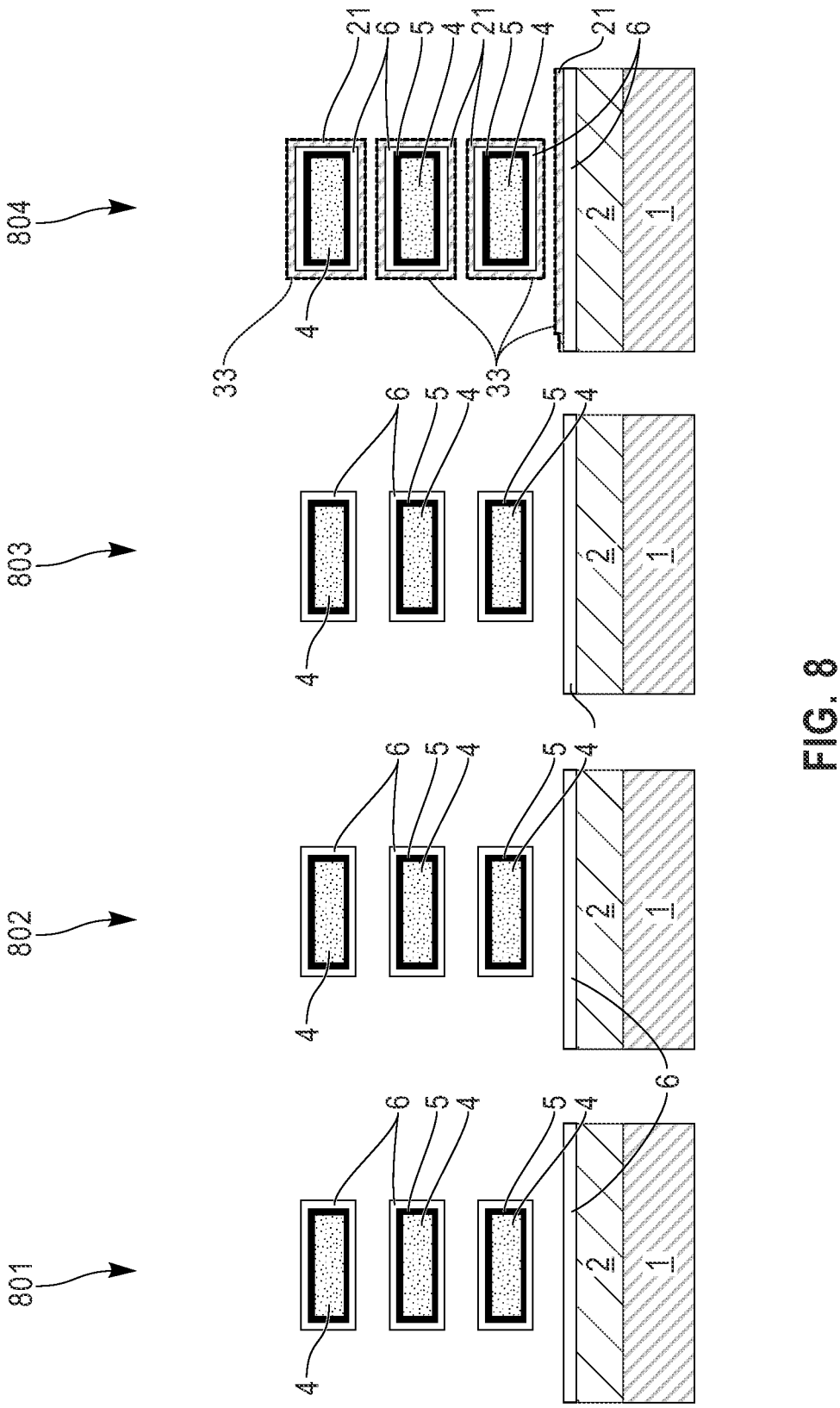
FIG. 8 depicts a cross-sectional view of the semiconductor structures after removing a top portion of the sacrificial oxide from the WFM 21 on the fourth nanosheet stack, in accordance with an embodiment of the present invention.

FIG. 8 depicts a cross-sectional view of the semiconductor structures after removing a top portion of sacrificial oxide 33 from WFM 21 on NS 804, in accordance with an embodiment of the present invention. After removing the top portion of sacrificial oxide 33, the bottom portion of the sacrificial oxide layer remains. The top portion of sacrificial oxide 33 can be removed by HCl or DICO$_2$ but is not limited to these etching processes. The remaining bottom portion of sacrificial oxide 33 is depicted as a dashed line and is labeled as sacrificial oxide 33 in FIG. 8.

In various embodiments, sacrificial oxide 33 can be a very thin layer of an oxide material containing either La or Y. For example, sacrificial oxide 33 can be a monolayer of the sacrificial oxide material. In other cases, sacrificial oxide 33 can be several atomic layers of the sacrificial oxide material. For example, the thickness of sacrificial oxide 33 can be two to three atoms thick or two or three atomic layers thick. In some embodiments, sacrificial oxide 33 is a several angstrom thick mix of La and Ti or Y and Ti, for example. In other cases, sacrificial oxide 33 forms a discontinuous metal oxide layer on WFM 21. After removing the top portion of sacrificial oxide 33, one of La or Y in sacrificial oxide 33 is remaining and is detectable using elemental surface analysis. As depicted, sacrificial oxide 33 is also above WFM 21 on dielectric 6 above substrate 1. The very thin layer of sacrificial oxide 33 leaves most of the space between WFM 21 above each of channels 4 (e.g., sacrificial oxide 33 does not significantly block or reduce the suspension area between WFM 21 on adjacent channels 4 in NS 804).

As depicted in FIG. 8, NS 804 includes WFM 21 over each surface of dielectric 6 (e.g., above substrate 1 and surround dielectric 6 over IL 5 on each of channels 4) with a very thin layer of sacrificial oxide 33 over WFM 21 (e.g., a couple of angstroms to a monolayer of sacrificial oxide 33 as described above). Each of NS 801, 802, and 803 include only the elements depicted and previously discussed with respect to FIG. 1 (e.g., in NS 101, NS 102, and NS 103).

Figure 9:
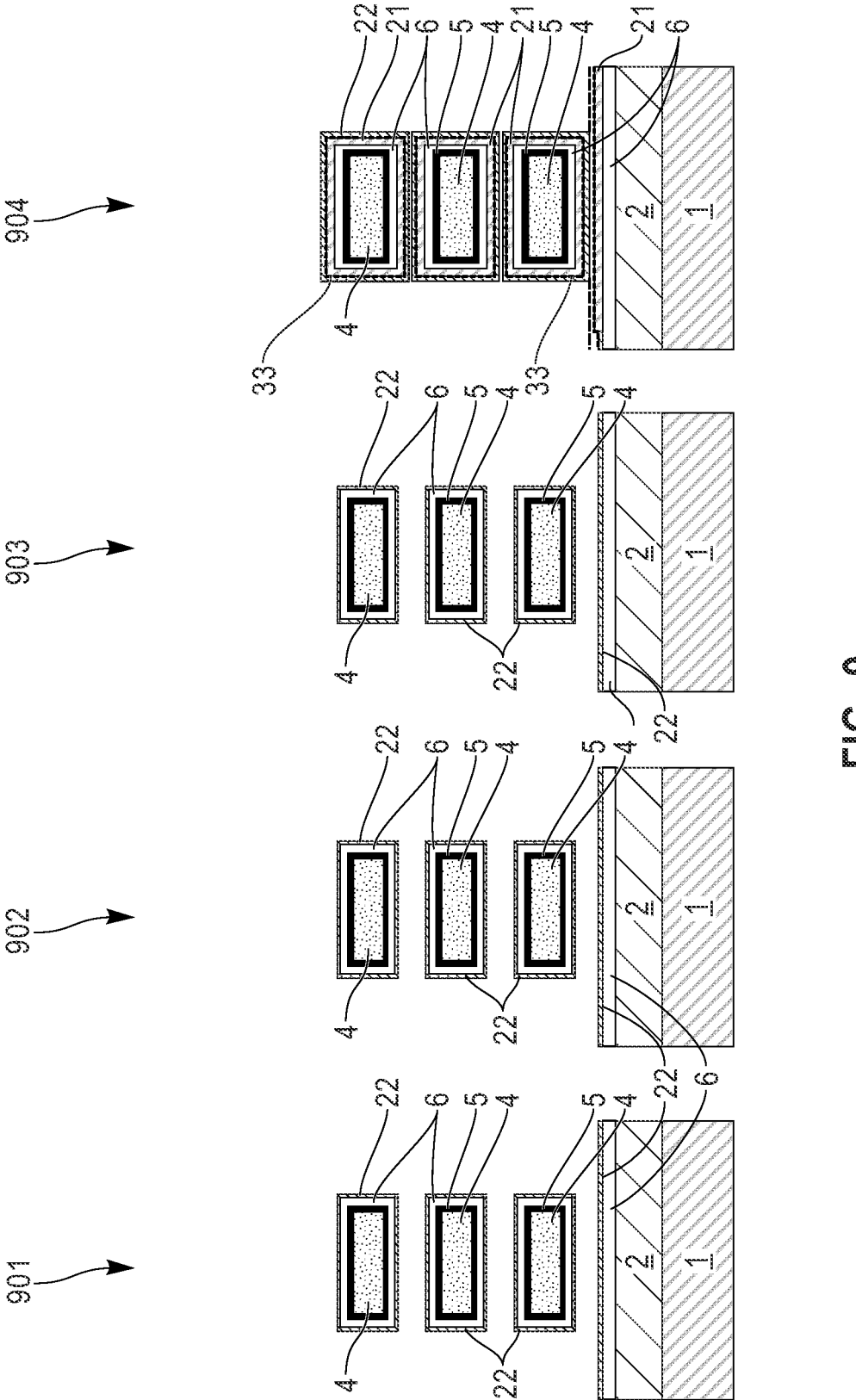
FIG. 9 depicts a cross-sectional view of the semiconductor structures after depositing the WFM over the sacrificial oxide in the fourth or rightmost nanosheet stack and over the dielectric material in the first three of the nanosheet stacks, in accordance with an embodiment of the present invention.

FIG. 9 depicts a cross-sectional view of the semiconductor structures after depositing WFM 22 over sacrificial oxide 33 in NS 904 and over dielectric 6 in NS 901, 902, and 903, in accordance with an embodiment of the present invention. As depicted, FIG. 9 illustrates the elements depicted in FIG. 8 with a layer of WFM 22 deposited over the exposed surfaces of the semiconductor structures. Using one of ALD, PVD, or CVD, a thin layer of WFM 22 is deposited covering the exposed surfaces. For example, the thickness of WFM 22 can range between 0.5 nm and 5 nm but is not limited to these thicknesses. WFM 22 can be any metal nitride. For example, WFM 22 can be composed of TiN. In some embodiments, WFM 22 is the same metal nitride material as WFM 21. In other embodiments, WFM 22 is composed of a different material than WFM 21. As depicted, WFM 22 is deposited on sacrificial oxide 33 in NS 904 and is a second WFM over channels 4 in NS 904. WFM 22 is on dielectric 6 in NS 901, 902, and 903 and on dielectric 6 above each portion of substrate 1.

Figure 10:
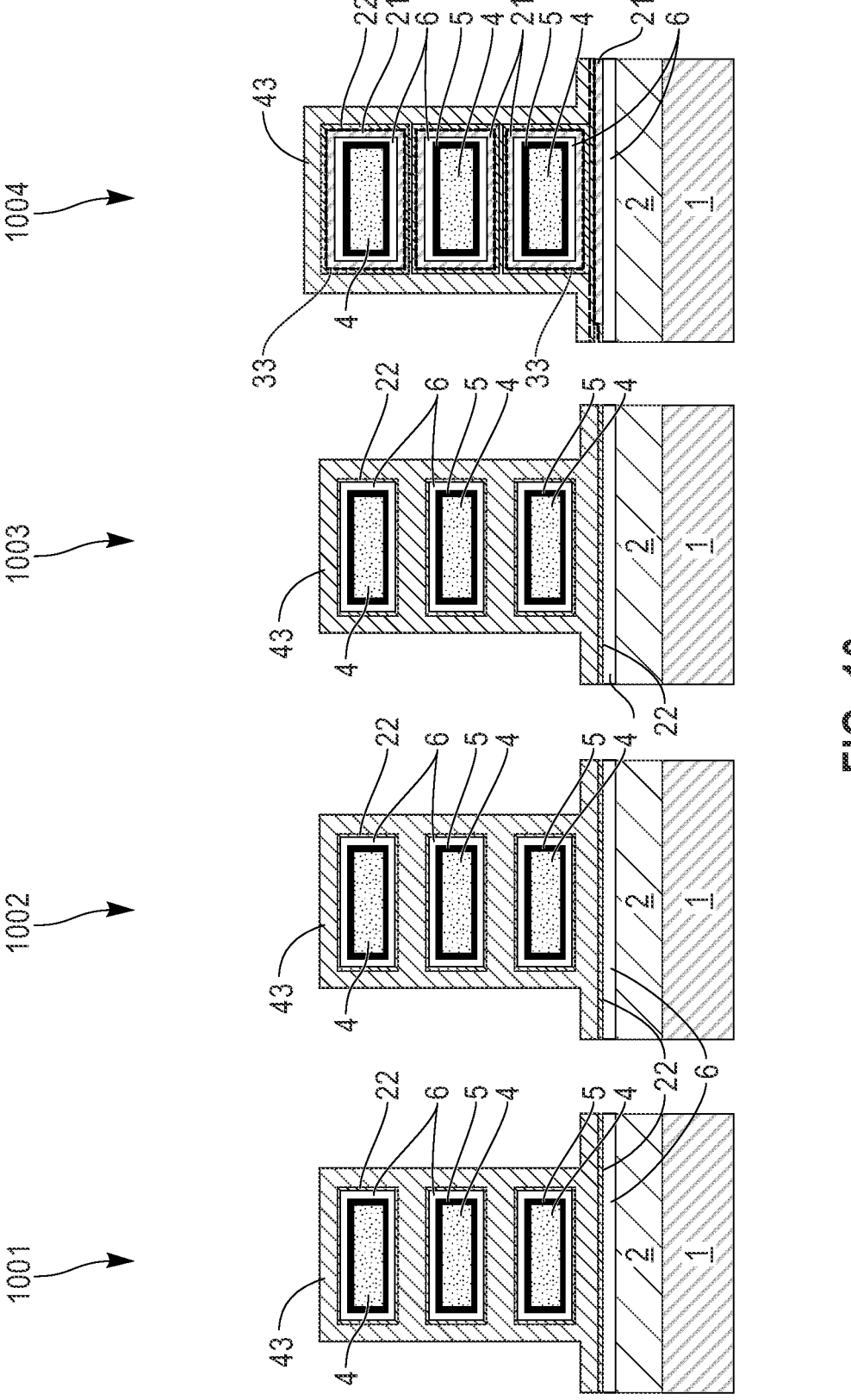
FIG. 10 depicts a cross-sectional view of the semiconductor structures of FIG. 9 and another deposited sacrificial oxide material layer, in accordance with an embodiment of the present invention.

FIG. 10 depicts a cross-sectional view of the semiconductor structures of FIG. 9 and sacrificial oxide 43, in accordance with an embodiment of the present invention. Using one of known oxide deposition processes, such as ALD, CVD, or PVD, a layer of sacrificial oxide 43 is deposited over NS 1001, 1002, 1003, and 1004 and the top surface of WFM 22 above each portion of substrate 1. In various embodiments, sacrificial oxide 43 is conformally deposited by ALD to fill the gap between adjacent surfaces of WFM 22 on each of channels 4 in each of the four depicted nanosheet stacks and above WFM 22 above sacrificial oxide 33 on WFM 21 on dielectric 6 above isolation layer 2. In various embodiments, sacrificial oxide 43 is the same or a similar oxide material as sacrificial oxide 33. For example, sacrificial oxide 43 is an oxide formed with one of La or Y. In some cases, sacrificial oxide 43 is a different oxide material than sacrificial oxide 43.

Figure 11:
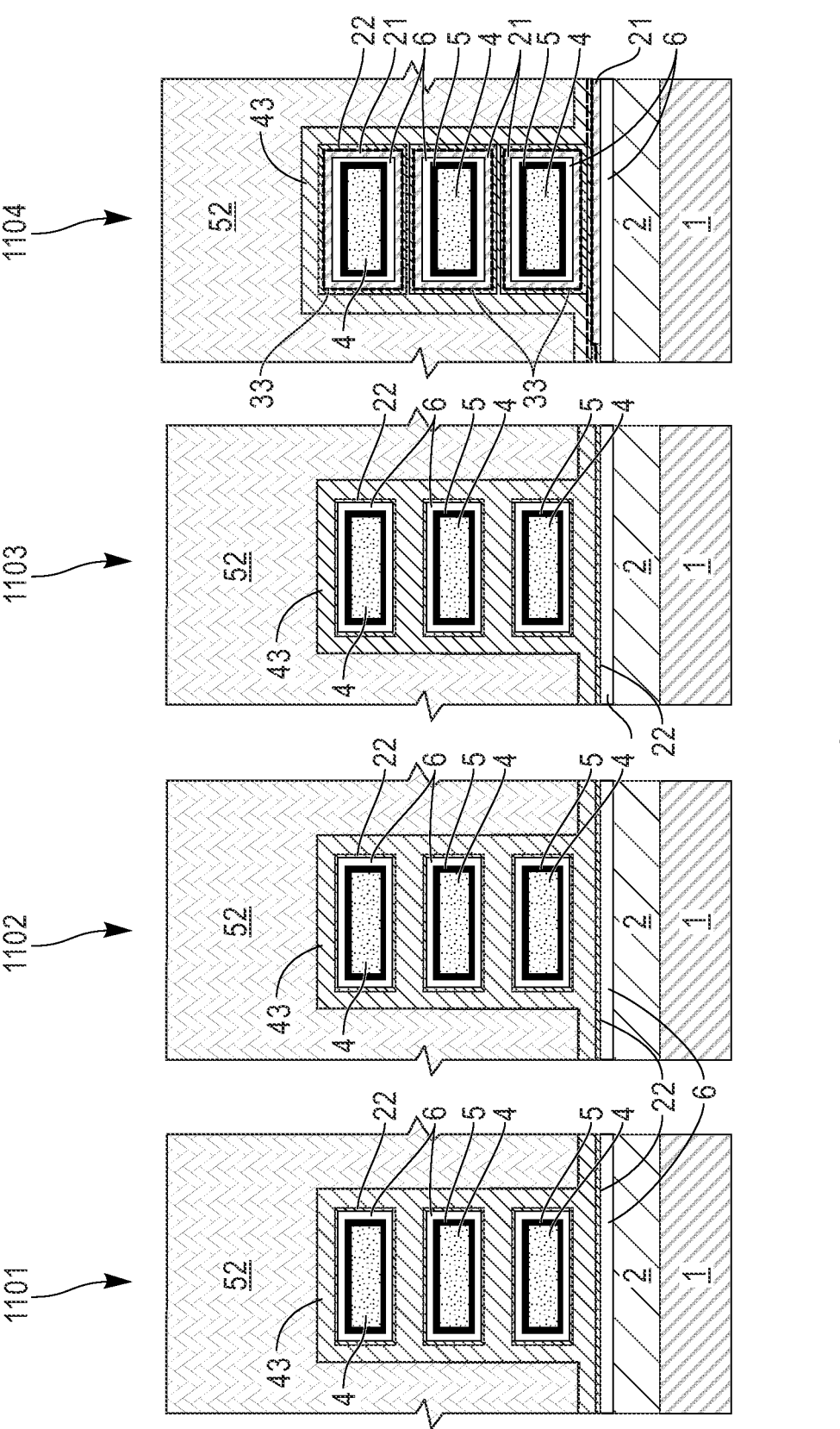
FIG. 11 depicts a cross-sectional view of the semiconductor structures after depositing another soft mask over each of the semiconductor structures of FIG. 10, in accordance with an embodiment of the present invention.

FIG. 11 depicts a cross-sectional view of the semiconductor structures after depositing soft mask 52 over each of the semiconductor structures of FIG. 10, in accordance with an embodiment of the present invention. As depicted, FIG. 11 includes the elements of FIG. 10 and soft mask 52. Soft mask 52 may be the same or a similar soft mask material as soft mask 42. For example, soft mask 52 is OPL. Soft mask 52 covers each of the nano sheet stacks (e.g., over NS 1101, 1102, 1103, and 1104).

Figure 12:
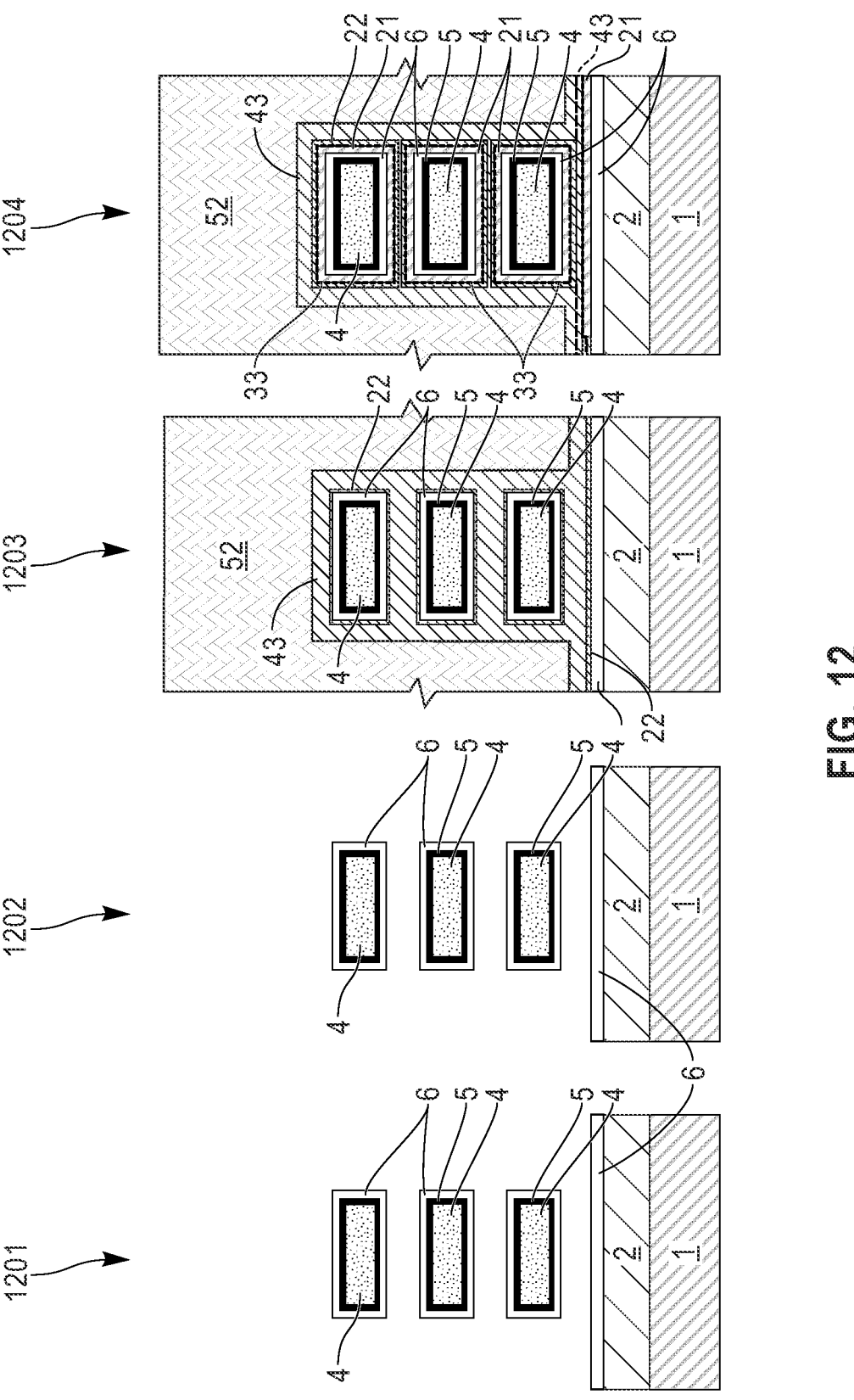
FIG. 12 depicts a cross-sectional view of the semiconductor structures after patterning and removing portions of the exposed soft mask, sacrificial oxide, and top WFM, in accordance with an embodiment of the present invention.

FIG. 12 depicts a cross-sectional view of the semiconductor structures after patterning and removing portions of soft mask 52 and removing exposed portions of sacrificial oxide 43 and WFM 22, in accordance with an embodiment of the present invention. As depicted, FIG. 12 illustrates the blocking of NS 1203 and NS 1204 and the removal of soft mask 52 from NS 1201 and 1202. After the removal of soft mask 52, then exposed portions of sacrificial oxide 43 and WFM 22 in NS 1201 and NS 1202 are removed, for example using a wet etching process or other processes previously discussed with respect to FIG. 6. As depicted, NS 1201 and 1202 are composed of channels 4, IL 5, and dielectric 6 over dielectric 6 on isolation layer 2.

Figure 13:
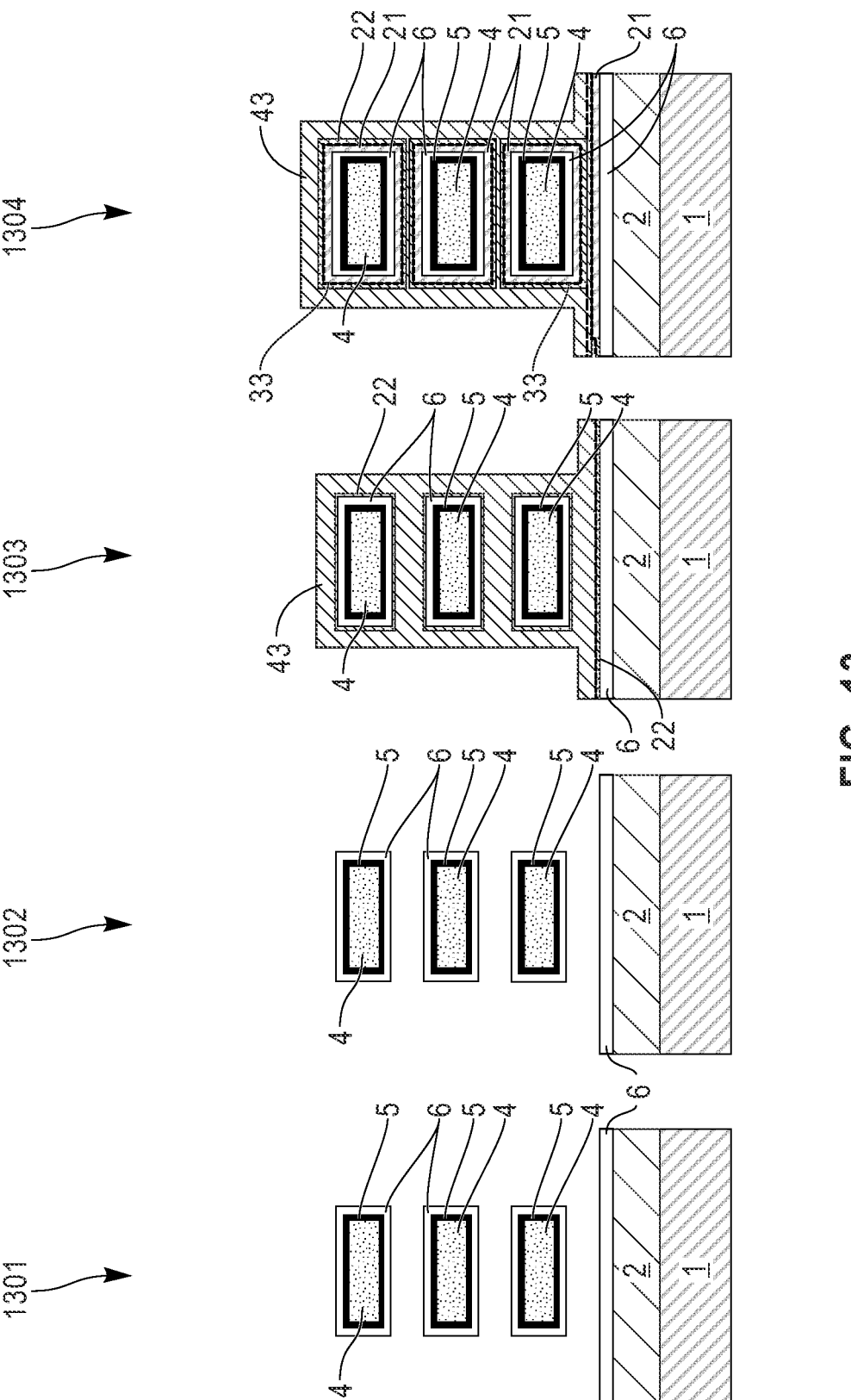
FIG. 13 depicts a cross-sectional view of the semiconductor structures after removing the remaining exposed portions of the soft mask, in accordance with an embodiment of the present invention.

FIG. 13 depicts a cross-sectional view of the semiconductor structures after removing the remaining portions of soft mask 52, in accordance with an embodiment of the present invention. As depicted, FIG. 13 includes the elements of FIG. 12 without soft mask 52. Each of NS 1301, 1302, 1303, and 1304 are unblocked or exposed. NS 1303 and NS 1304 include sacrificial oxide 43 surrounding channels 4 (e.g., on sacrificial oxide 33) and on sacrificial oxide 33 above substrate 1.

Figure 14:
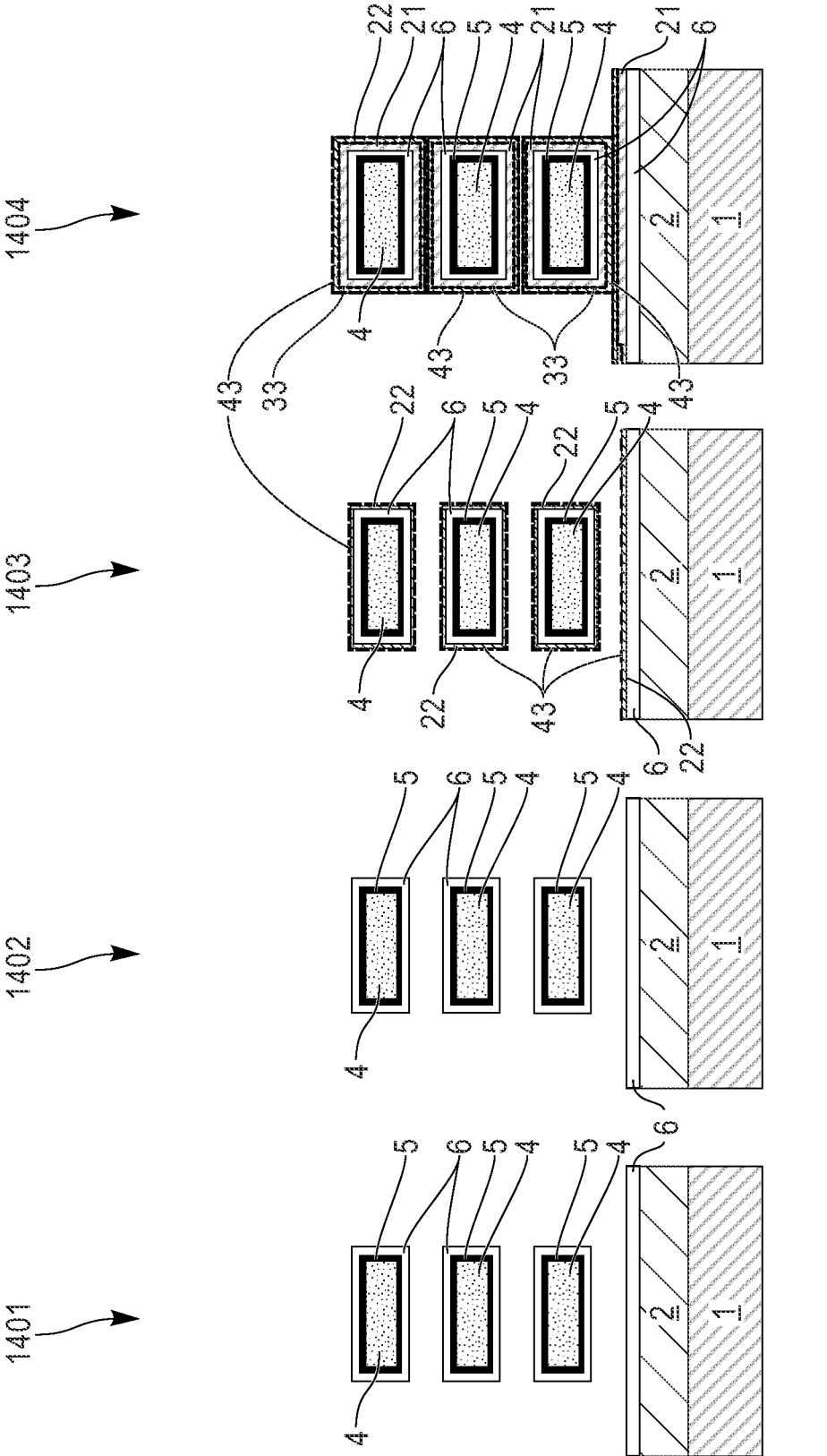
FIG. 14 depicts a cross-sectional view of the semiconductor structures after removing a top portion of the exposed sacrificial oxide over the top WFM in the third and fourth nanosheet stacks, in accordance with an embodiment of the present invention.

FIG. 14 depicts a cross-sectional view of the semiconductor structures after removing a top portion of sacrificial oxide 43 over WFM 22 in NS 1403 and NS 1404, in accordance with an embodiment of the present invention. Using one or more oxide removal processes, such as a wet chemical etch process, the top portion of sacrificial oxide 43 is removed from the surfaces of the remaining WFM 22 in NS 1403 and NS 1404. As previously discussed in detail with reference to FIG. 8, a very thin layer of sacrificial oxide 43 remains over WFM 22 and is depicted as a dashed line. In some cases, the remaining sacrificial oxide 43 is a compound or mix of La and Ti that can be several angstroms (e.g., two to five angstroms) thick. In other cases, sacrificial oxide 43 can have a monolayer thickness or can have several atom layers of sacrificial oxide 43 on WFM 22. For example, the thickness of sacrificial oxide 43 can be two to three atoms or two to five atomic layers thick. In other cases, sacrificial oxide 43 forms a discontinuous metal oxide layer on WFM 22. Sacrificial oxide 43 surrounds WFM 22 on each of channels 4 and is on WFM 22 above substrate 1. Sacrificial oxide 43 is a second sacrificial oxide material remaining in NS 1404. Sacrificial oxide 43 is the first and only sacrificial oxide material on NS 1403.

As depicted, NS 1404 includes the remaining portions of sacrificial oxide 43 on WFM 22 that surrounds sacrificial oxide 33 that is around channels 4 and above substrate 1, the remaining portions of sacrificial oxide 33 on WFM 21 on dielectric 6 (e.g., on dielectric 6 that surrounds IL 5 on each of channels 4 and above substrate 1).

NS 1403 includes the remaining portions of sacrificial oxide 43 on WFM 22 that surrounds dielectric 6 (e.g., WFM 22 surrounds IL 5 on each of channels 4 and above substrate 1).

NS 1402 and NS 1401 include the elements depicted in NS 101 and NS 102 in FIG. 1.

Figure 15:
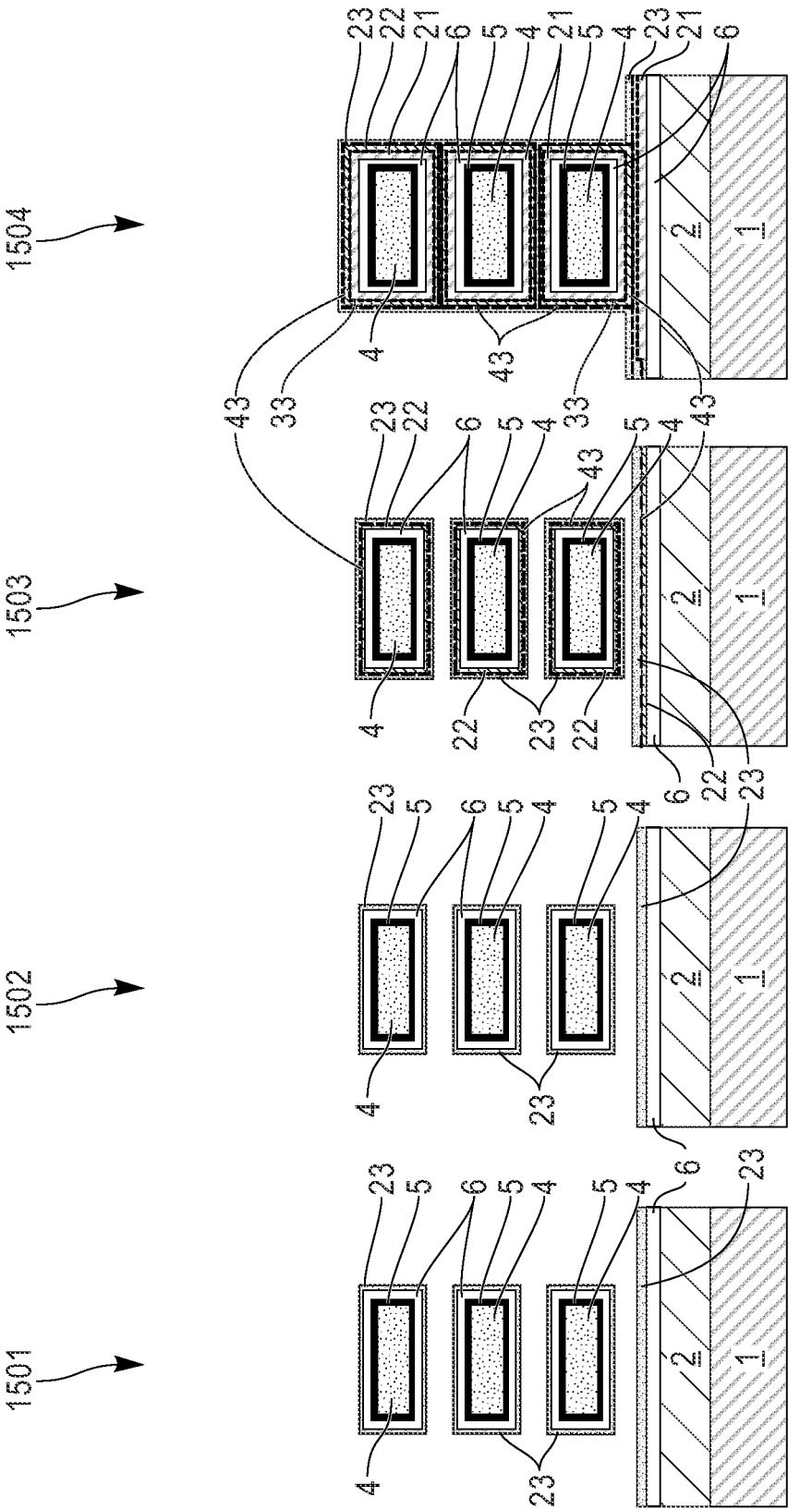
FIG. 15 depicts a cross-sectional view of the semiconductor structures after depositing a third WFM over the semiconductor structures, in accordance with an embodiment of the present invention.

FIG. 15 depicts a cross-sectional view of the semiconductor structures after depositing WFM 23 over the semiconductor structures, in accordance with an embodiment of the present invention. As depicted, FIG. 15 illustrates NS 1501 and 1502 each with a single WFM layer (e.g., WFM 23), NS 1503 with WFM 22 and WFM 23 in the nanosheet stack, and NS 1504 with three layers of WFM (e.g., WFM 23, 22, and 21). As depicted in FIG. 15, the deposition of WFM 23 pinches off the gaps between sacrificial oxide 43 on adjacent channels 4 in NS 1504 and the gap between the bottom channel portion of channels 4 and substrate 1 (e.g., pinches off any area between sacrificial oxide 43 on channels 4 and above substrate 1). As depicted FIG. 15 includes the elements of FIG. 14 and WFM 23. WFM 23 can be deposited with the previously discussed WFM deposition process. WFM 23 can be the same metal nitride material as either or both of WFM 22 and WFM 21 and can have a similar thickness. In some embodiments, WFM 23 is a different metal nitride material than WFM 22 or WFM 21.

Figure 16:
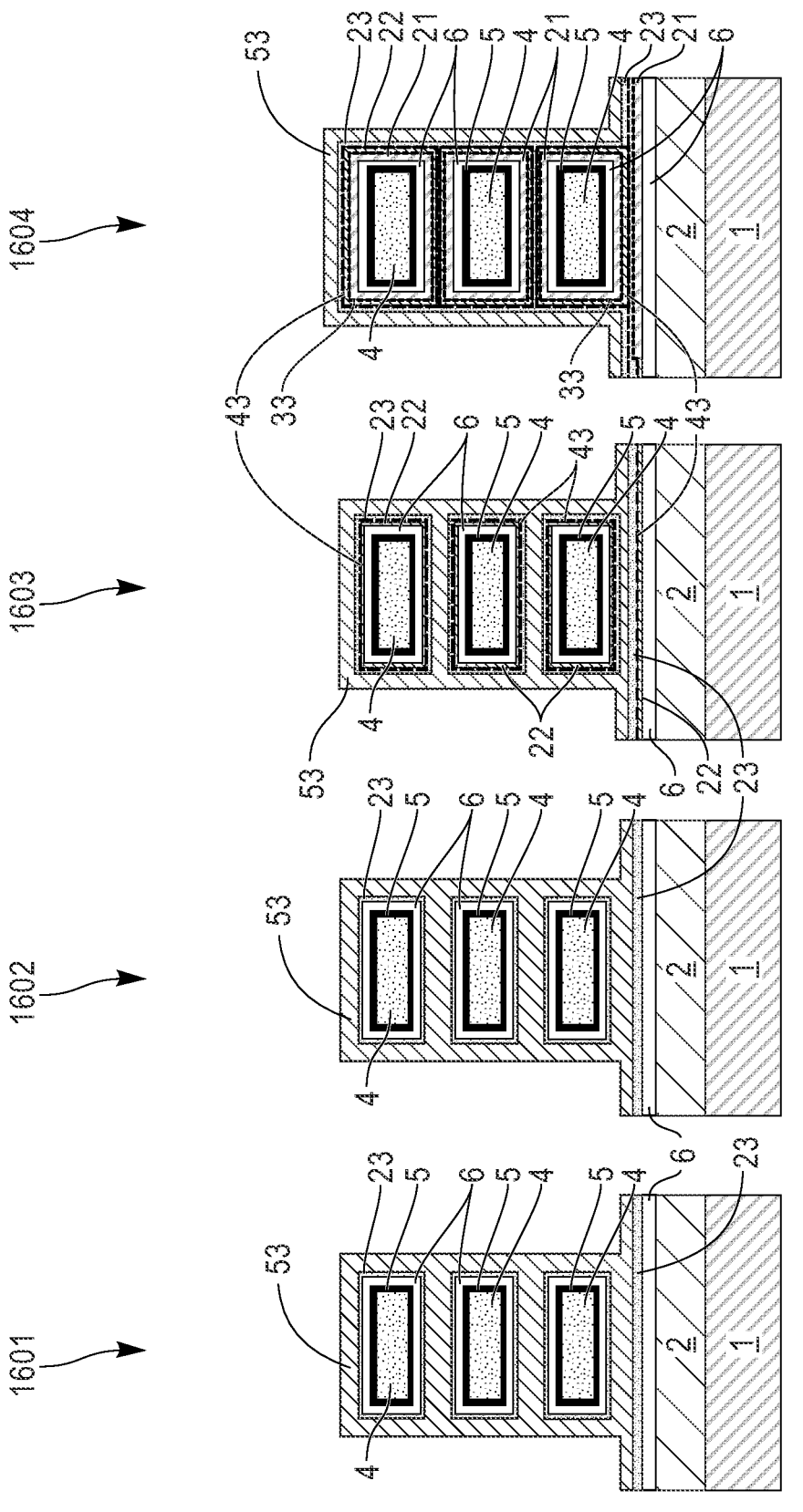
FIG. 16 depicts a cross-sectional view of the semiconductor structures after depositing another layer of a sacrificial oxide on the third WFM, in accordance with an embodiment of the present invention.

FIG. 16 depicts a cross-sectional view of the semiconductor structures after depositing sacrificial oxide 53 on WFM 23, in accordance with an embodiment of the present invention. As depicted, FIG. 16 includes the elements of FIG. 15 and sacrificial oxide 53. As depicted, sacrificial oxide 53 is not deposited between channels 4 in NS 1604 as previously discussed, WFM 23 pinches off the gaps between sacrificial oxide 43 on WFM 22 in NS 1504 in FIG. 15 and NS 1604 in FIG. 16. In various embodiments, sacrificial oxide 53 can be composed of the same or similar materials as sacrificial oxide 33 previously discussed with respect to FIG. 3. For example, sacrificial oxide 53 is one of a lanthanum oxide material or a yttrium oxide material but is not limited to these oxide materials that is conformally deposited over each of the semiconductor structures (e.g., over each of NS 1601, 1602, 1603, and 1604 and between WFM 23 above channels 4 in NS 1601, 1602, and 1603 and the surfaces of WFM 23 above substrate 1 in NS 1601, 1602, and 1603).

Figure 17:
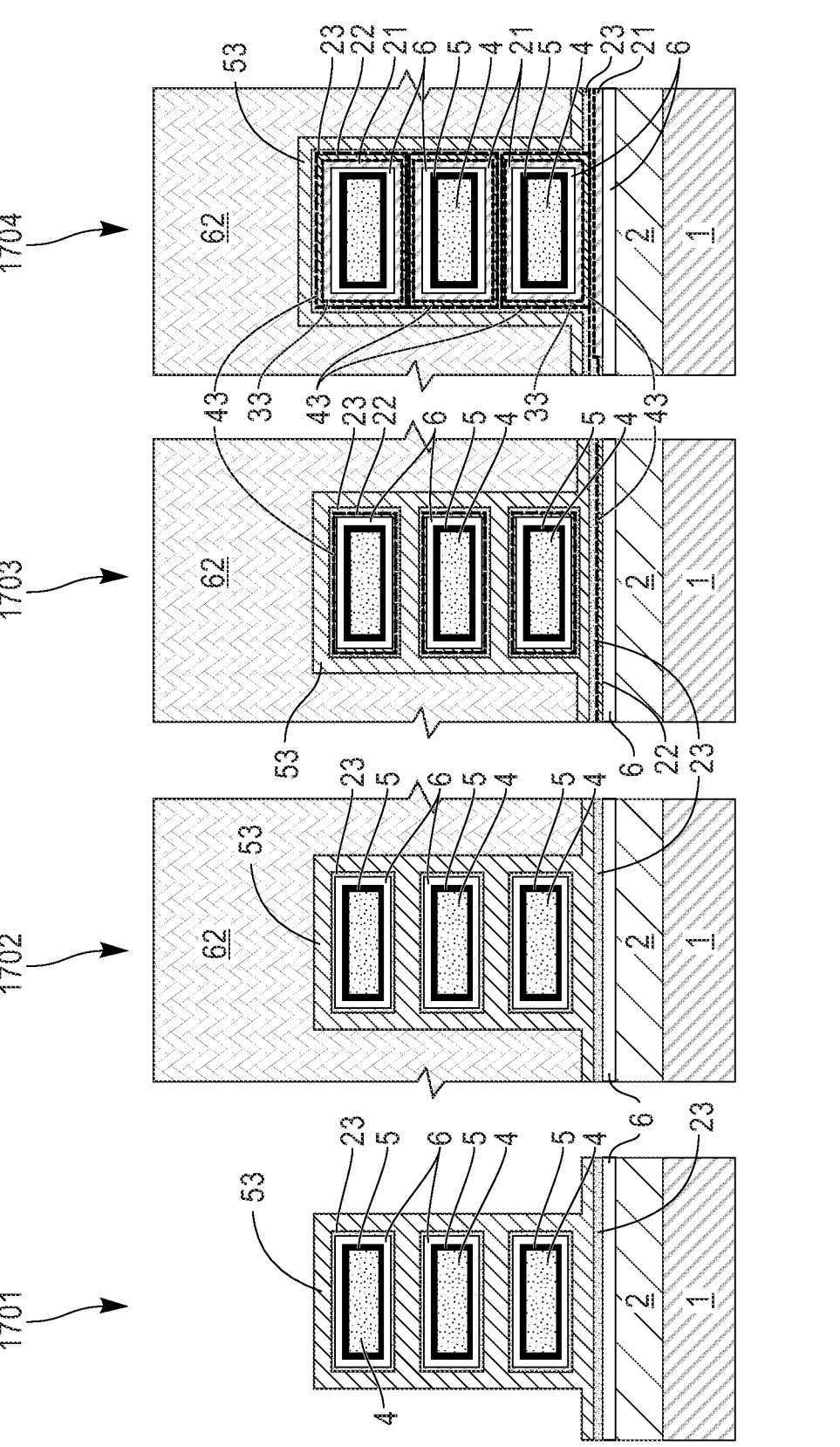
FIG. 17 depicts a cross-sectional view of the semiconductor structures after depositing another soft mask and removing a portion of the deposited soft mask over the first nanosheet stack, in accordance with an embodiment of the present invention.

FIG. 17 depicts a cross-sectional view of the semiconductor structures after depositing soft mask 62 and removing a portion of soft mask 62 over NS 1701, in accordance with an embodiment of the present invention. As depicted, FIG. 17 illustrates NS 1702, 1703, and 1704 that are covered by soft mask 62 and NS 1701 without soft mask 62. NS 1701 is essentially the same as NS 1601. NS 1702, 1703, and 1704 include the elements of NS 1602, 1603, and 1604, respectively but are blocked by soft mask 62.

Figure 18:
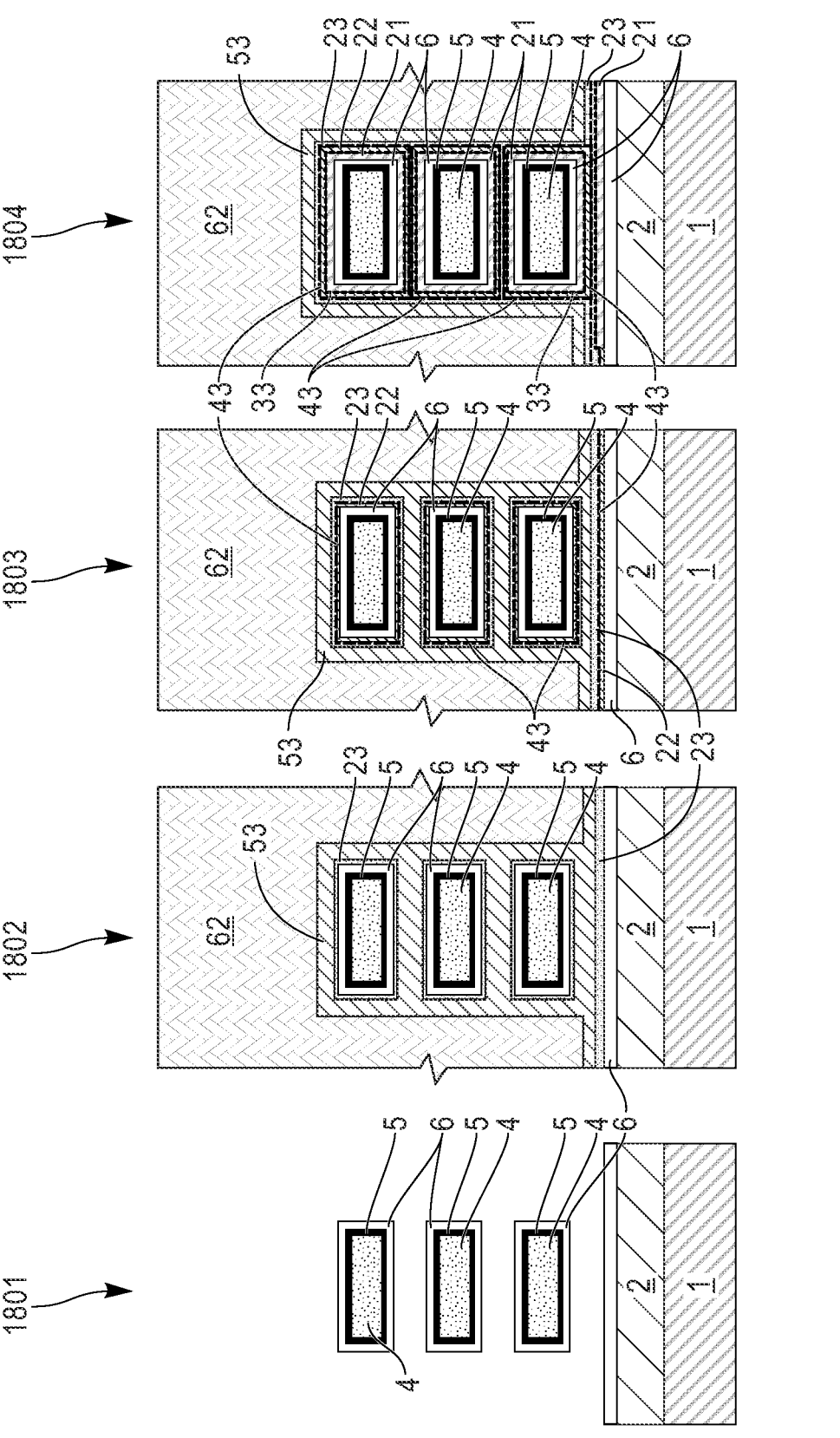
FIG. 18 depicts a cross-sectional view of the semiconductor structures after removing sacrificial oxide and the third WFM from the first nanosheet stack, in accordance with an embodiment of the present invention.

FIG. 18 depicts a cross-sectional view of the semiconductor structures after removing sacrificial oxide 53 and WFM 23 from NS 1801, in accordance with an embodiment of the present invention. As depicted, FIG. 18 includes NS 1702, 1703, and 1704 that are unchanged from FIG. 17 and NS 1801 without sacrificial oxide 53 or WFM 23. As depicted, NS 1801 includes channels 4, IL 5, and dielectric 6 over dielectric 6 on isolation layer 2. Sacrificial oxide 53 and WFM 23 are removed using the etching processes previously discussed with respect to FIG. 6. The surfaces of dielectric 6 in and under NS 1801 are exposed after the etching processes.

Figure 19:
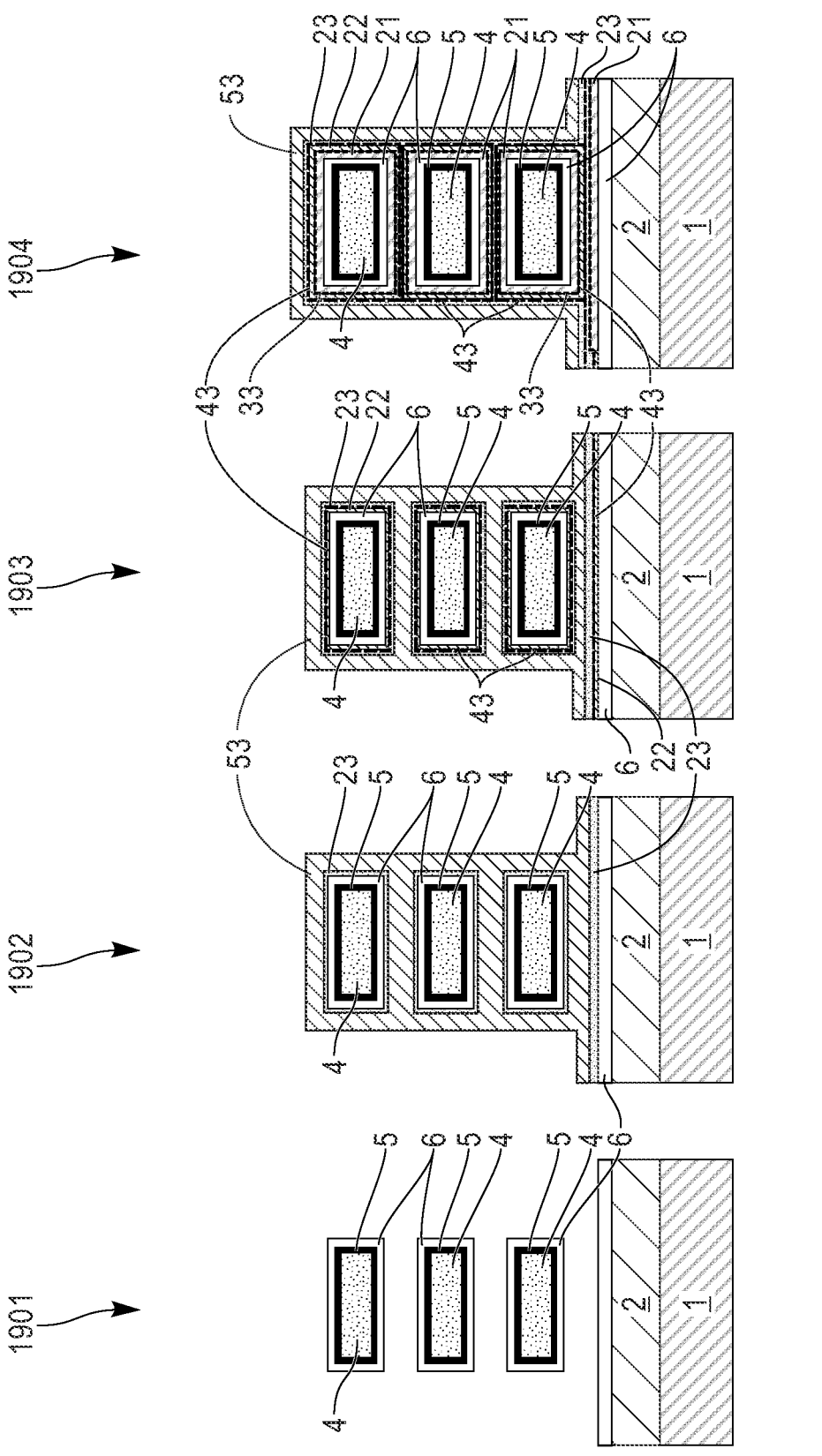
FIG. 19 depicts a cross-sectional view of the semiconductor structures after removing the soft mask, in accordance with an embodiment of the present invention.

FIG. 19 depicts a cross-sectional view of the semiconductor structures after removing soft mask 62, in accordance with an embodiment of the present invention. As depicted, FIG. 19 includes the elements of FIG. 18 without soft mask 62. NS 1901 is essentially the same as NS 1801. In FIG. 19, all of the nanosheet stacks (e.g., NS 1901, 1902, 1903, and 1904) are unblocked or exposed.

Figure 20:
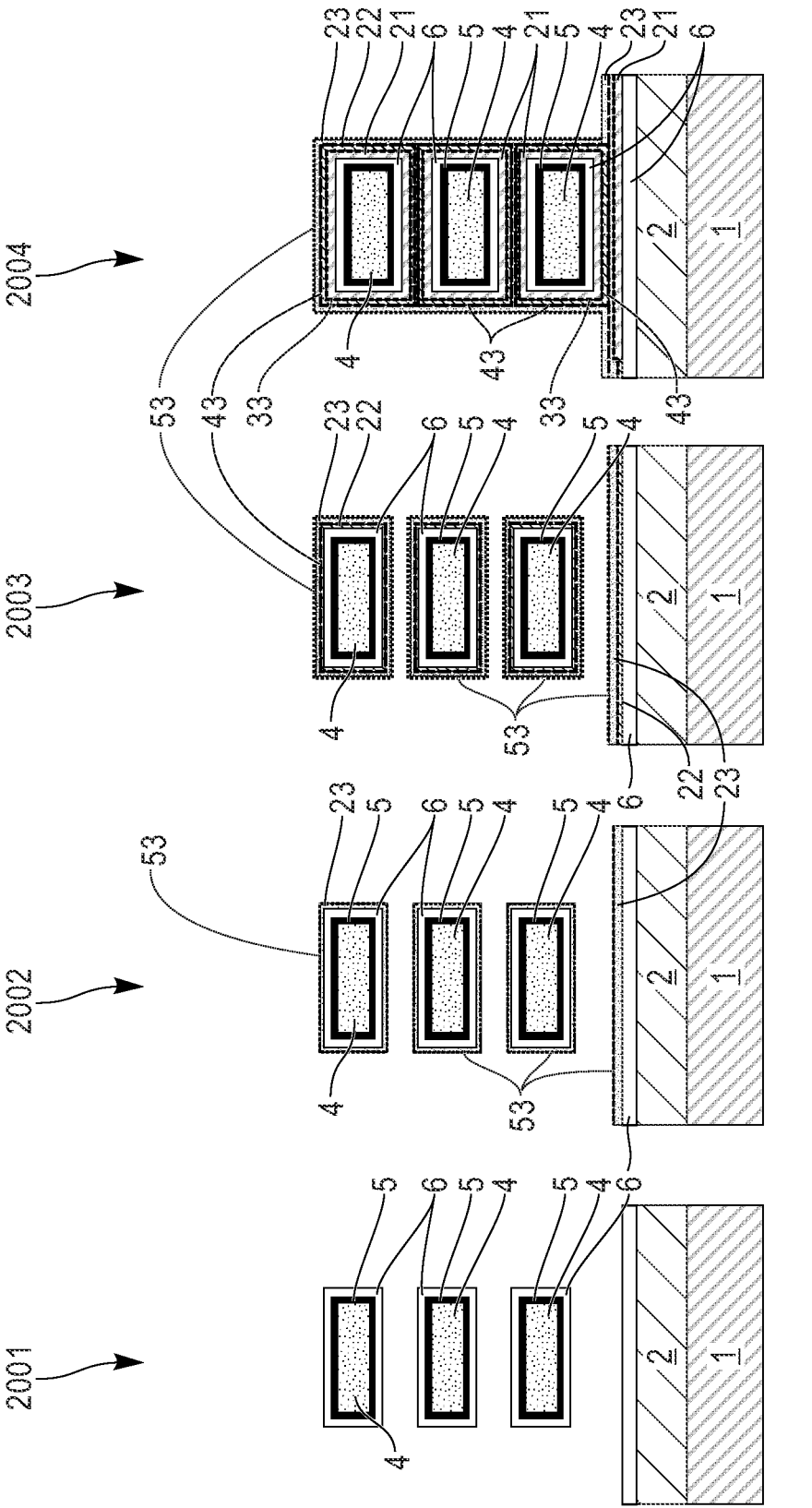
FIG. 20 depicts a cross-sectional view of the semiconductor structures after removing a top portion of the sacrificial oxide from exposed portions of the third WFM on the last three nanosheet stacks, in accordance with an embodiment of the present invention

FIG. 20 depicts a cross-sectional view of the semiconductor structures after removing a top portion of sacrificial oxide 53 from WFM 23 on NS 2002, 2003, and NS 2004, in accordance with an embodiment of the present invention. As depicted, FIG. 20 includes NS 2001, which is the same as NS 1901, and NS 2002, NS 2003, and NS 2004 with a bottom portion of sacrificial oxide 53 that is a dashed line labeled as sacrificial oxide 53 covering WFM 23 on exposed surfaces of WFM 23 in and under each of NS 2001, 2002, and 2003 and over WFM 23 on the outside surfaces of NS 2004. In various embodiments, sacrificial oxide 53 is the same as sacrificial oxide 33. In some embodiments, the remaining sacrificial oxide 53 is a different oxide material than either or both of sacrificial oxide 43 and sacrificial oxide 33. As previously discussed with respect to FIG. 8, a very thin layer of sacrificial oxide 53 resides on each surface of WFM 23 present in FIG. 19. As previously discussed, in some cases, sacrificial oxide 53 may be discontinuous or may be a compound material with a mix of La or Y with Ti, for example, but is not limited to this mix of materials (e.g., the mix of a material with one of La or Y may vary depending on the metal nitride deposited for WFM 23). In some cases, the remaining portions of sacrificial oxide 53 may be one to three angstroms thick or have a thickness that is a couple of atoms thick. For example, the thickness of sacrificial oxide 53 can be two to three atoms or atomic layers thick.

As depicted, FIG. 20 illustrates NS 2004 with the remaining portions of sacrificial oxide 53 over WFM 23 on the outside of NS 2004. Sacrificial oxide 53 is not between adjacent surfaces of WFM 23 in NS 2004 because as previously discussed, WFM 23 fills the gaps between sacrificial oxide 43 around each of channels 4 and is under sacrificial oxide 43 on the bottom channel of channels 4 filling the gap above sacrificial oxide 43 on WFM 22 above sacrificial oxide 33 on WFM 21 that is on dielectric 6 above substrate 1. NS 2004 also includes the remaining portions of sacrificial oxide 43 over WFM 22 that is around each of channels 4 and above substrate 1 (e.g., as previously described with reference to FIG. 15). NS 2004 includes the remaining portions of sacrificial oxide 33 over WFM 21 surrounding dielectric 6 that is around IL 5 on channels 4 and dielectric 6 above substrate 1 (e.g., as previously described in FIGS. 8 and 14).

As depicted, NS 2003 includes the remaining portions of sacrificial oxide 53 over WFM 23 around channels 4 and above substrate 1 (e.g., sacrificial oxide 53 is between WFM 23 that surrounds sacrificial oxide 43 on WFM 22 on dielectric 6 surrounding IL 5 on each of channels 4 and above substrate 1 as discussed previously regarding FIG. 14).

NS 2002 includes the remaining portions of sacrificial oxide 53 over WFM 23 on dielectric 6 that is on IL 5 on channels 4 and above substrate 1. NS 2001 includes the elements as previously discussed with respect to FIG. 1 (e.g., in NS 101).

Figure 21:
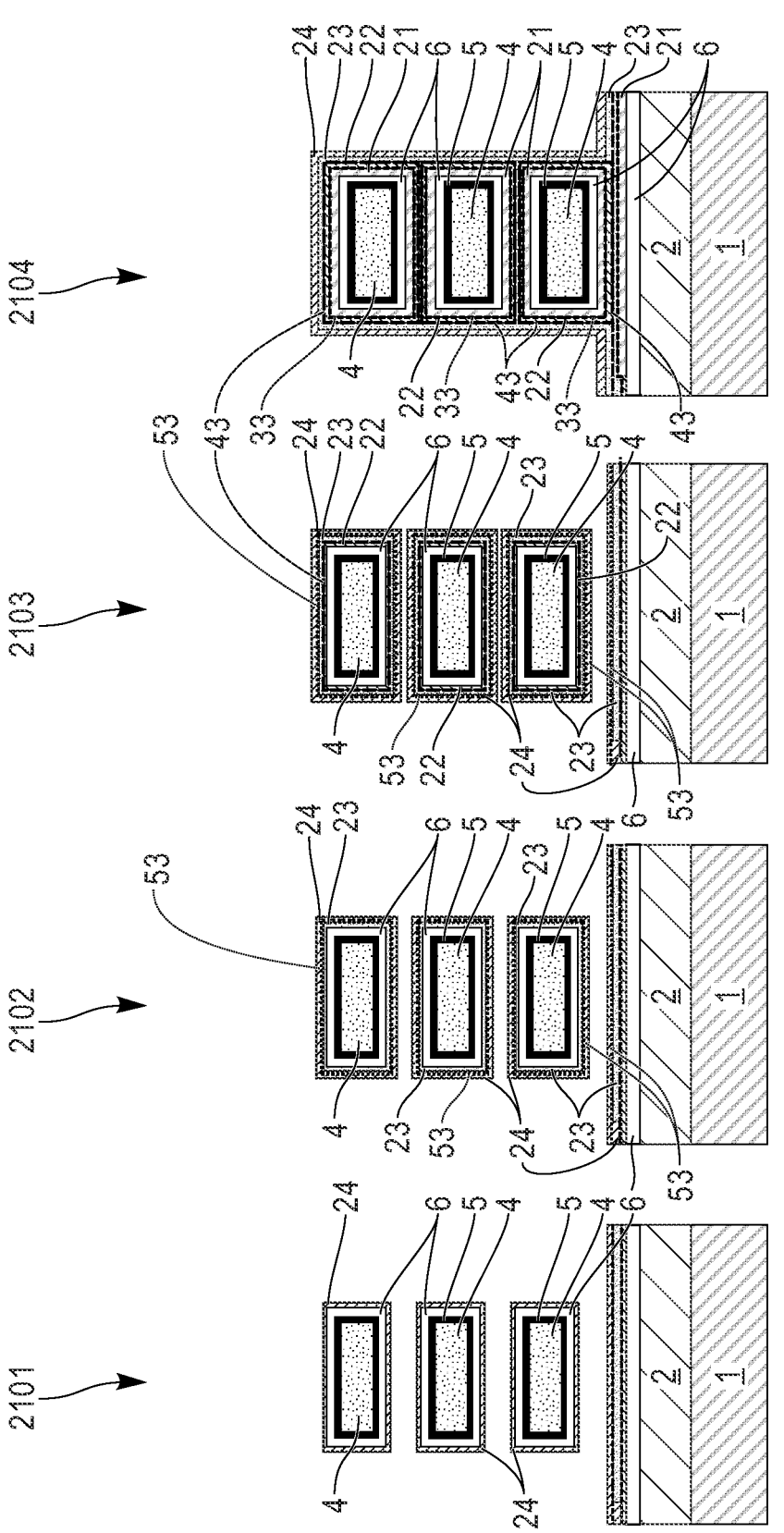
FIG. 21 depicts a cross-sectional view of the semiconductor structures after depositing another WFM around and under each of the first three nanosheet stacks and on the fourth nanosheet stack, in accordance with an embodiment of the present invention.

FIG. 21 depicts a cross-sectional view of the semiconductor structures after depositing WFM 24 over and under each of NS 2101, 2102, 2103, and over NS 2104, in accordance with an embodiment of the present invention. As depicted, FIG. 21 includes the elements of FIG. 20 and WFM 24. WFM 24 is deposited under and around dielectric 6 in NS 2101, over and around sacrificial oxide 53 in NS 2102 and NS 2103, and over NS 2104. Because the gap between adjacent portions of sacrificial oxide 53 above channels 4 in NS 2104 is not present (e.g., there is no gap between adjacent 53 on adjacent channels 4), WFM 24 cannot be deposited between channels 4 or surrounding channel 4 in NS 2104. However, gaps between sacrificial oxide 53 remain in NS 2101, 2102, and 2103 and are sufficient for the conformal deposition of WFM 24. WFM 24 may the same or a different WFM as WFM 21 discussed with respect to FIG. 2. WFM 24 may be the same or a different WFM material than the material in WFM 22 or WFM 23.

FIG. 22 depicts a cross-sectional view of the semiconductor structures after depositing WFM 54 under and around each channel portions of NS 2201, 2202, and 2203, and over NS 2204, depositing cap 55 over exposed surfaces of WFM 54 in each of NS 2201, 2202, 2203, and 2204, and depositing gate electrode material 56 over cap 55 on each of NS 2201, 2202, 2203, and 2204, in accordance with an embodiment of the present invention. As depicted, FIG. 22 includes the elements of FIG. 21 with WFM 54, cap 55, and gate electrode material 56. WFM 54, cap 55, and gate electrode material 56 each extend above substrate 1 adjacent to NS 2201, NS 2202, NS 2203, and NS 2204.

In various embodiments, WFM 54 is an n-type work function metal. For example, WFM 54 can be an aluminum containing WFM, such as TiAl, TiAlC, AlC or in an embodiment, WFM 54 is TiN but is not limited to these materials. In another embodiment, WFM 54 is a stack composed of multiple layers of materials where one of the materials is an aluminum containing metal. In one embodiment, WFM 54 is an aluminum containing metal as a work function metal.

As depicted, WFM 54 is on a portion of WFM 24 on substrate 1 adjacent to and abutting each of NS 2201, 2201, 2203, and 2204. Additionally, WFM 54 is around the outside of NS 2204 and is deposited over, under, and around each of channels 4 in NS 2201, NS 2202, and NS 2203 and above portions of substrate 1. In NS 2201, NS 2202, 2203, and 2204, WFM 54 is deposited over exposed surfaces of WFM 24. As depicted, WFM 54 is deposited over NS 2204 but is not deposited between channels 4 or above substrate 1 or under the bottom channel of channels 4 in NS 2204 (e.g., as depicted and previously discussed with respect to FIG. 20, there is no gap or space between layers of WFM 23 around channels 4 and above substrate 1 in NS 2204).

WFM 54 fills the gap between WFM 24 surrounding adjacent channels 4 in each of NS 2201, 2202, and 2203 and fills the gap between WFM 24 above substrate 1 and WFM 24 on the bottom channel of channels 4. For example, in NS 2201, WFM 54 is deposited over WFM 24 that is on dielectric 6 around channels 4 and on dielectric 6 on isolation layer 2 above substrate 1. WFM 54 fills the gaps between exposed surfaces of WFM 24. For example, WFM 54 fills the gaps between WFM 24 that is on dielectric 6 on IL 5 around adjacent channels 4 and between WFM 24 on dielectric 6 above substrate 1 and WFM 24 that is around dielectric 6 surrounding the bottom channel 4.

In NS 2202, WFM 54 fills the gap between adjacent surfaces of WFM 24 where WFM 24 is on sacrificial oxide 53 that is on WFM 22 on dielectric 6. In other words, WFM 54 is between WFM 24 surrounding each of channels 4 that are covered by IL 5, dielectric 6, WFM 22, sacrificial oxide 53, and WFM 24 and is between WFM 24 on the bottom channel of channels 4 and WFM 24 on sacrificial oxide 53 on WFM 23 on sacrificial oxide 43 that is on WFM 22 on dielectric 6 on isolation layer 2 on substrate 1.

In NS 2203, WFM 54 is over WFM 24 that is on the remaining bottom portion of sacrificial oxide 53 on WFM 23 around and under channels 4. For example, WFM 24 around channels 4 surrounds WFM 23 is on sacrificial oxide 43 over WFM 22 surrounding dielectric 6 on IL 5 that is around each of channels 4. WFM 54 is also on WFM 24 between the bottom channel 4 and above substrate 1. WFM 54 fills the gap between WFM 24 around bottom channel of channels 4 and WFM 24 that is above sacrificial oxide 53 where sacrificial oxide 53 is on WFM 23 that is above sacrificial oxide 43 on WFM 22 is above dielectric 6 on isolation layer 2 on substrate 1. WFM 54 fills the gaps between WFM 24 around channels 4 and fills the gap between WFM 24 around the bottom channel of channels 4 and WFM 24 above substrate 1. WFM 54 fills the gaps between adjacent surfaces of WFM 24 in NS 2203.

In NS 2204, WFM 54 surrounds WFM 24 that is around the outside of NS 2204 (e.g., WFM 54 is not between or under channels 4). In NS 2201, 2202, and 2203, WFM 54 fills the gap between adjacent surfaces of WFM 24. In other words, in NS 2201, 2202, and 2203, WFM 54 fills the gaps between WFM 24 around adjacent channels 4 and WFM 24 under the bottom channel of channels 4 and WFM 24 above substrate 1.

Cap 55 can be a cap layer composed of a metal nitride material, such as TiN. WFM 54, cap 55, and gate electrode material 56 can be deposited using known deposition processes (e.g., CVD, PVD, ALD, etc.). Cap 55 is deposited over WFM 54 around the outside of NS 2201, 2202, 2203, and 2204 and above WFM 54 above substrate 1.

Gate electrode material 56 can be any known gate electrode material suitable for forming NFET or PFET devices. Gate electrode material 56 can be deposited around from any of NS 2201, NS 2202, NS 2203, or NS 2204. Gate electrode material 56 can be one of W, Al, Co, Ru, or other known gate electrode material used for FET device formation. As known to one skilled in the art, each of NS 2201, 2202, 2203, or 2204 can form one of an NFET or a PFET device depending on the doping and material selection in NS 2201, 2202, 2203, or 2204.

As depicted, NS 2204 includes three layers of a work function metal covered by a remaining portion of a sacrificial oxide material (e.g., WFM 21, 22, and 23 with sacrificial oxides 33, 43, and 53) where there are no layers of sacrificial oxide 53 or WFM 24 on WFM 23 between channels 4 or between WFM 23 above substrate 1 in NS 2204. As depicted in FIG. 22, the fourth layer of a work function metal (e.g., WFM 24) surrounds the outside surfaces of WFM 24 on NS 2204. A fifth work function metal (i.e., WFM 54) is over WFM 24 and under cap 55.

In other examples, layers of sacrificial oxide 53 or 43 may or may not be present in a nanosheet stack depending on the thickness of deposited materials and the spacing between adjacent channels 4 in NS 2204. Additionally, if the gap between adjacent channels 4 in the nanosheet stack, such as NS 2204 is large enough more than three layers of a work function metal may be deposited around channels 4 in NS 2204 and three or more layers of a sacrificial oxide material may be present around each of channels 4 and above substrate 1.

In various embodiments, WFM 21, 22, 23, and 24 are composed of the same work function metal. In some embodiments, WFM 21, 22, 23, and 24 are not composed of the same work function metal (e.g., WFM 21 may be different than each of WFM 22, 23, and 24 or WFM 22 but the same as WFM 23 or WFM 24, etc.). Similarly, each of sacrificial oxide 33, 43, and 53 can be the same oxide material or may be different oxide materials.

As depicted in FIG. 22, NS 2204 includes gate electrode material 56 over cap 55 and WFM 54 over cap 55. WFM 54 is over WFM 24 on the remaining portions on sacrificial oxide 53 that surround the outside of NS 2204. WFM 23 is over sacrificial oxide 43 surrounding channels 4 and filling the gaps between channels 4 and between channels 4 and substrate 1 as previously discussed (e.g., WFM 24, sacrificial oxide 53, WFM 54, cap 55, and gate electrode material 56 are not under or between each of channels 4). NS 2204 includes the remaining portion of sacrificial oxide 43 over WFM 22 surrounding and under each of channels 4 and above substrate 1. NS 2204 also includes the remaining portion of sacrificial oxide 33 on WFM 21 surrounding dielectric 6 on IL 5 on channels 4 and above substrate 1 (e.g., as previously described with reference to FIG. 8).

In one embodiment, the processes discussed with respect to FIGS. 1-22 are performed on a single nanosheet stack to form NS 2204. In this embodiment, the process steps depicted in FIGS. 1-22 for blocking and unblocking of additional nanosheet stacks (e.g., nanosheet stacks 2201, 2202, and 2203 are not present) are not performed. The processes, in this case, would include work function metal depositions, oxide depositions, removal of the top surface of the oxide using etching processes, cap deposition, and gate electrode deposition.

NS 2203 includes gate electrode material 56 over cap 55 and cap 55 over WFM 54 on the outside surfaces WFM 24 but gate electrode material 56 and cap 55 are not over WFM 24 that is between or under channels 4. In NS 2203, WFM 24 can be over the remaining portions of sacrificial oxide 53 on WFM 23 that is on the remaining portion of sacrificial oxide 43 as previously discussed. The remaining portions of sacrificial oxide 43 are over WFM 22. As depicted in FIG. 22, WFM 22 is on dielectric 6 (e.g., on IL 5 and above substrate 1).

NS 2202 includes gate electrode material 56 over cap 55 and cap 55 over WFM 54 on the outside surfaces WFM 24 but gate electrode material 56 and cap 55 are not over WFM 24 that is between or under channels 4. NS 2202 includes the remaining portions on sacrificial oxide 53 on WFM 23 surrounding and under each of channels 4 and above substrate 1 where WFM 23 resides on dielectric 6 (e.g., on IL 5 and above substrate 1).

NS 2201 includes gate electrode material 56 over cap 55 and cap 55 over WFM 54 on the outside surfaces WFM 24 but gate electrode material 56 and cap 55 are not between or under dielectric 6 that is above and around channels 4 (e.g., as depicted, WFM 54 is between WFM 24 that is on dielectric 6 on IL 5 and above substrate 1).

Using the structure and material layers for NS 2204 (e.g., four layers of WFM including WFM 21, 22, 23, and 24), a FET device formed using NS 2204 would have high effective work function. When the effective work function of a FET device formed from NS 2204 is compared to the effective work function of FET devices formed from NS 2201, NS 2202, and NS 2203, the FET formed with NS 2204 would have the highest effective work function FET device. Similarly, NS 2203 forms a FET device with three layers of a work function metal with a very thin oxide material layer from one of sacrificial oxide 33 and 43 between WFM 212 and WFM 22 and between WFM 23 and WFM 24, respectively has a relatively high effective work function value. The effective work function of NS 2203 is less than the effective work function provided by NS 2204 but is greater than the effective work function of NS 2202 and NS 2201.

In other words, when comparing the effective work function of NS 2201, 2202, 2203, and 2204, the following comparison could be made: the effective work function of NS 2204 is greater than the effective work function of NS 2203, the effective work function of NS 2203 is greater than the effective work function of NS 2202, and the effective work function of NS 2202 is greater than the effective work function of NS 2201.

Using a sacrificial oxide material (e.g., $La_2O_3$, $Y_2O_3$, or other similar oxide material) instead of a soft mask material between channel portions of a nanosheet stack during FET device formation provides an ability to more effectively remove residual materials between the adjacent channel portions in the nanosheet stacks. The ability to effectively remove residual materials between adjacent channel portions of the nanosheet stacks opens up the gap between adjacent channels in the nanosheet stack. Opening up the gap between the adjacent channels of the nanosheet stack allows the deposition of additional layers of WFM over, under, and around the portions of the channel material in order to increase the effective work function for FET devices.

What is claimed is:

1. A semiconductor structure, comprising:
   a plurality of channels in a nanosheet stack over a semiconductor substrate;
   for each channel of the plurality of channels in the nanosheet stack:
   a first work function metal layer surrounding a respective channel in the nanosheet stack;
   a first oxide material layer fully surrounding the first work function metal layer;
   a second work function metal layer surrounding the first oxide material layer;
   a second oxide material layer fully surrounding the second work function metal layer;
   a third work function metal layer surrounding the second oxide material layer; and
   a third oxide material layer over the third work function metal layer;
   a fourth work function metal layer over the third oxide material layer;
   a fifth work function metal layer over the fourth work function metal layer;
   a cap layer over the fifth work function metal layer;
   a gate electrode material over the cap layer; and
   wherein the first work function metal layer, the first oxide material layer, the second work function metal layer, and the second oxide material layer are further stacked on the semiconductor substrate and present between the semiconductor substrate and the third work function metal layer of the respective channel of the plurality of channels in the nanosheet stack that is closest to the semiconductor substrate.

2. The semiconductor structure of claim 1, wherein the first oxide material layer and the second oxide material layer are each yttrium oxide.

3. The semiconductor structure of claim 2, wherein the third oxide material layer has a composition of $Y_2O_3$.

4. The semiconductor structure of claim 2, wherein the third oxide material layer has a composition of $La_2O_3$.

5. The semiconductor structure of claim 1, wherein the first work function metal layer is a metal nitride material.

6. The semiconductor structure of claim 1, wherein the second oxide material layer has a lanthanum-titanium mixed interface layer.

7. The semiconductor structure of claim 1, wherein the fifth work function metal layer is an aluminum containing work function material.

8. The semiconductor structure of claim 1, wherein the first work function metal layer, the second work function metal layer, the third work function metal layer, and the fourth work function metal layer are each composed of a same material.

9. The semiconductor structure of claim 1, wherein the first oxide material layer and the second oxide material layer are each lanthanum oxide.

10. The semiconductor structure of claim 9, wherein the third oxide material layer has a composition of $Y_2O_3$.

11. The semiconductor structure of claim 9, wherein the third oxide material layer has a composition of $La_2O_3$.

12. A semiconductor structure, comprising:
- a first plurality of channels in a first nanosheet stack over a semiconductor substrate;
- a first plurality of work function metal layers:
  - surrounding each channel of the first plurality of channels in the first nanosheet stack, wherein adjacent layers of the work function metal of the first plurality of work function metal layers are each separated and fully surrounded by an oxide material; and

- on the semiconductor substrate, between the semiconductor substrate and a channel of the plurality of channels in the first nanosheet stack that is closest to the semiconductor substrate, wherein the adjacent layers of the work function metal of the first plurality of work function metal layers are each separated by the oxide material; and
- a second plurality of channels in a second nanosheet stack, wherein:
  - a second plurality of work function metal layers surrounds each channel of the second plurality of channels; and
  - the second plurality of work function metal layers comprises a different number of layers than are present in the first plurality of work function metal layers.

13. The semiconductor structure of claim 12, further comprising:
- an n-type work function metal over an outside layer of the first plurality of layers;
- a cap layer over the n-type work function metal; and
- a gate electrode material over the cap layer.

14. The semiconductor structure of claim 12, wherein the first plurality of work function metal layers comprises at least four layers.

* * * * *